US012300971B2

(12) United States Patent
Kurita et al.

(10) Patent No.: US 12,300,971 B2
(45) Date of Patent: May 13, 2025

(54) LASER DEVICE AND METHOD FOR GENERATING LASER LIGHT

(71) Applicant: HAMAMATSU PHOTONICS K.K., Hamamatsu (JP)

(72) Inventors: Takashi Kurita, Hamamatsu (JP); Yoshinori Kato, Hamamatsu (JP); Toshiyuki Kawashima, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 630 days.

(21) Appl. No.: 17/625,431

(22) PCT Filed: Jun. 25, 2020

(86) PCT No.: PCT/JP2020/025070
§ 371 (c)(1),
(2) Date: Jan. 7, 2022

(87) PCT Pub. No.: WO2021/010128
PCT Pub. Date: Jan. 21, 2021

(65) Prior Publication Data
US 2022/0263292 A1    Aug. 18, 2022

(30) Foreign Application Priority Data

Jul. 18, 2019    (JP) .................. 2019-132996

(51) Int. Cl.
*H01S 5/40*    (2006.01)
*H01S 5/00*    (2006.01)
(Continued)

(52) U.S. Cl.
CPC .......... *H01S 5/4012* (2013.01); *H01S 5/0078* (2013.01); *H01S 5/0428* (2013.01);
(Continued)

(58) Field of Classification Search
CPC .... H01S 5/4012; H01S 5/0078; H01S 5/0428; H01S 5/0612; H01S 5/0657; H01S 5/4087
See application file for complete search history.

(56) References Cited

U.S. PATENT DOCUMENTS

| | | |
|---|---|---|
| 5,285,460 A | 2/1994 | Ueda et al. |
| 2010/0177794 A1* | 7/2010 | Peng ............... H01S 3/2316 372/25 |

(Continued)

FOREIGN PATENT DOCUMENTS

| | | |
|---|---|---|
| CN | 101990729 B | 2/2013 |
| JP | H04-352483 A | 12/1992 |

(Continued)

OTHER PUBLICATIONS

Onodera N, "THz frequency generation by modelocked semiconductor lasers", Electronics Letters, vol. 32, No. 11, May 23, 1996, p. 1013-p1015, XP006005154.
(Continued)

*Primary Examiner* — Yuanda Zhang
(74) *Attorney, Agent, or Firm* — Faegre Drinker Biddle & Reath LLP

(57) ABSTRACT

A laser apparatus includes a light source unit and a light combining unit. The light source unit outputs first laser light and second laser light having a wavelength different from that of the first laser light to different optical paths. The light combining unit is optically coupled to the light source unit, and combines the first laser light and the second laser light to generate a burst pulse with a frequency according to a difference between the wavelength of the first laser light and the wavelength of the second laser light. In the light source unit, the wavelengths of the first laser light and the second
(Continued)

laser light are set in advance or settable such that the frequency of the burst pulse is 1 GHz or more.

11 Claims, 23 Drawing Sheets

(51) Int. Cl.
 *H01S 5/042* (2006.01)
 *H01S 5/06* (2006.01)
 *H01S 5/065* (2006.01)
(52) U.S. Cl.
 CPC .......... *H01S 5/0612* (2013.01); *H01S 5/0657* (2013.01); *H01S 5/4087* (2013.01)

(56) References Cited

U.S. PATENT DOCUMENTS

| | | |
|---|---|---|
| 2016/0111849 A1 | 4/2016 | Shin |
| 2018/0058935 A1 | 3/2018 | Yu et al. |

FOREIGN PATENT DOCUMENTS

| | | |
|---|---|---|
| JP | H06-214266 A | 8/1994 |
| JP | 2002-043685 A | 2/2002 |
| JP | 2007-242978 A | 9/2007 |
| JP | 2007-271925 A | 10/2007 |
| JP | 2012-515450 A | 7/2012 |
| JP | 2016-524864 A | 8/2016 |
| JP | 2017-504824 A | 2/2017 |
| JP | 2018-021809 A | 2/2018 |
| KR | 10-2011-0112347 A | 10/2011 |
| WO | WO-2010/083091 A2 | 7/2010 |
| WO | WO-2014/193062 A1 | 12/2014 |
| WO | WO-2015/060385 A1 | 4/2015 |
| WO | WO-2015/163954 A2 | 10/2015 |
| WO | WO 2016/081042 A1 | 5/2016 |
| WO | WO-2018/110222 A1 | 6/2018 |

OTHER PUBLICATIONS

Pelusi, M.D. et al., "THz optical beat frequency generation from a single mode locked semiconductor laser," Applied Physics Letters, US, Jul. 1997, vol. 71, No. 4, pp. 449-451.

Mao, Dong et al., "Flexible high-repetition-rate ultrafast fiber laser," Scientific Reports 3, Art. 3223, 2013, pp. 1-5.

International Preliminary Report on Patentability mailed Jan. 27, 2022 for PCT/JP2020/025070.

\* cited by examiner

Fig.2
(a)
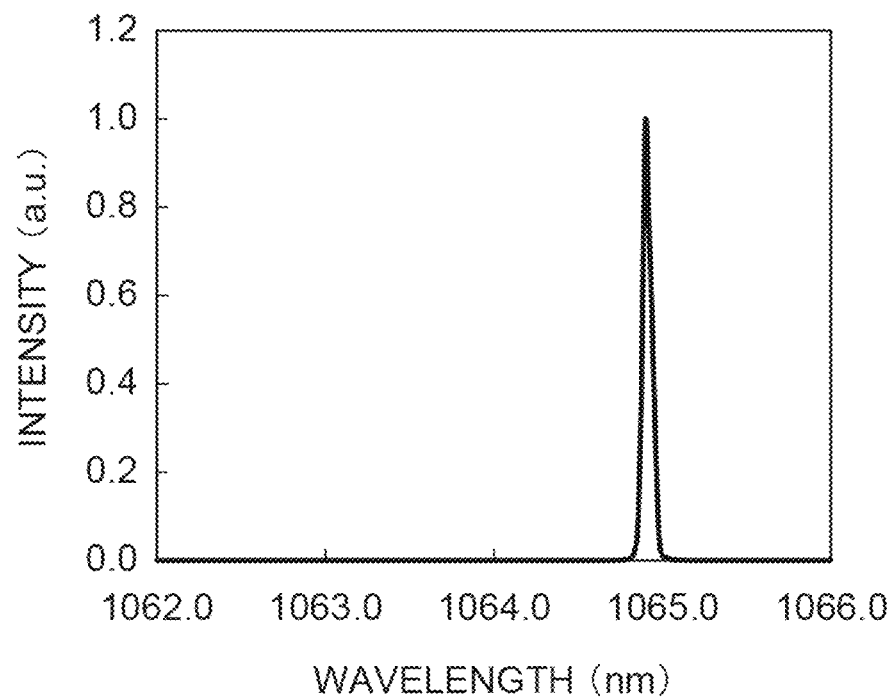
(b)
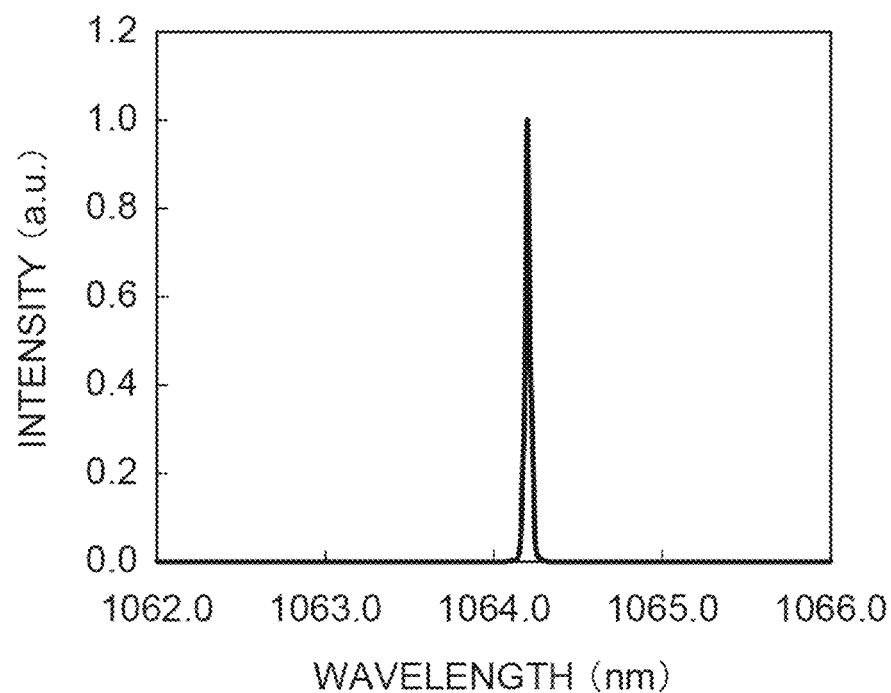

Fig.5
(a)
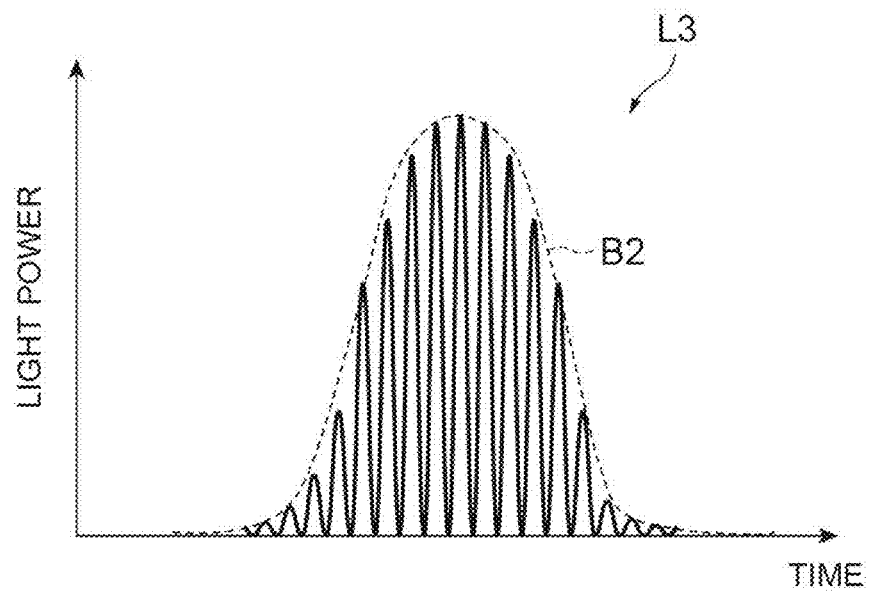
(b)
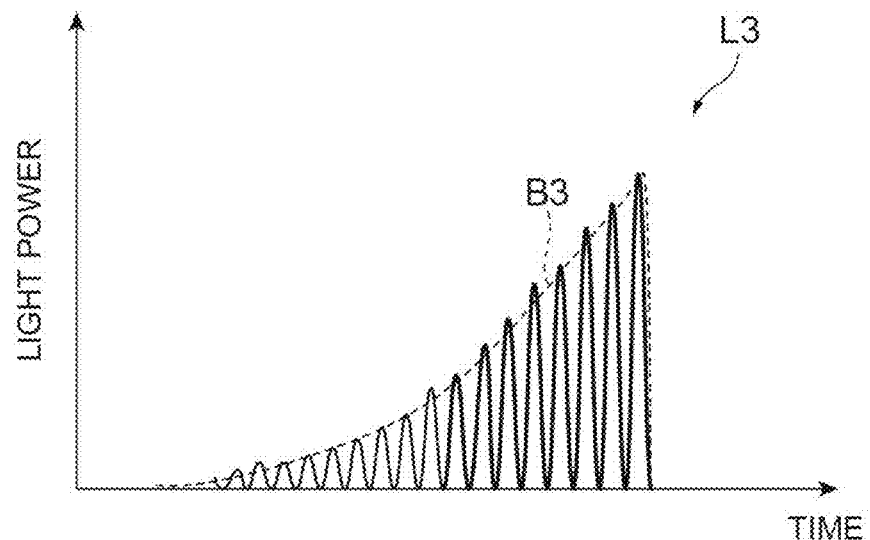

Fig.7
(a)
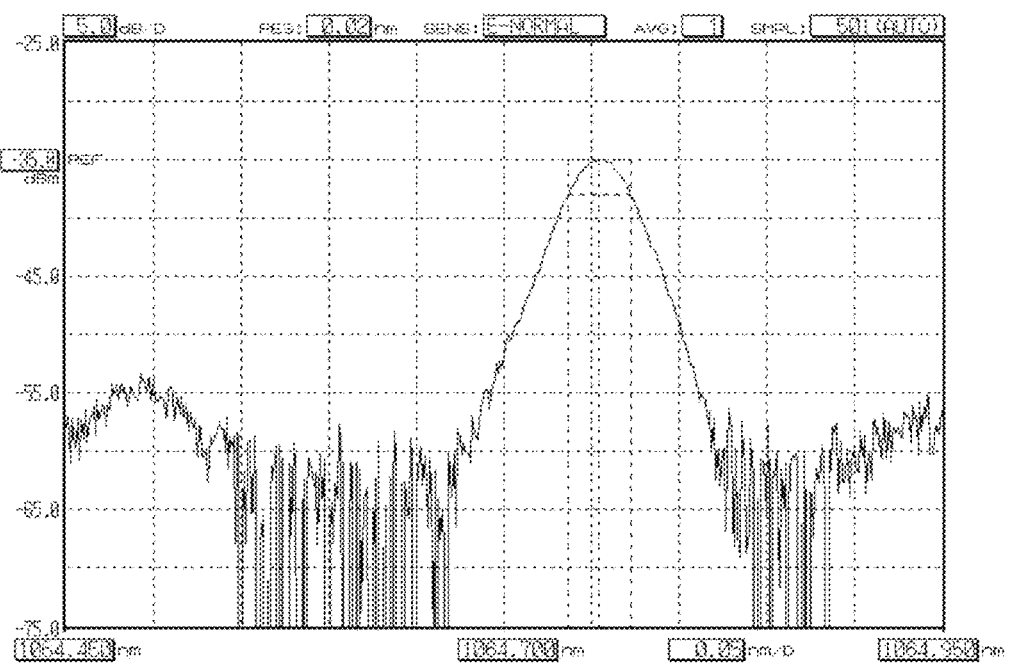
(b)
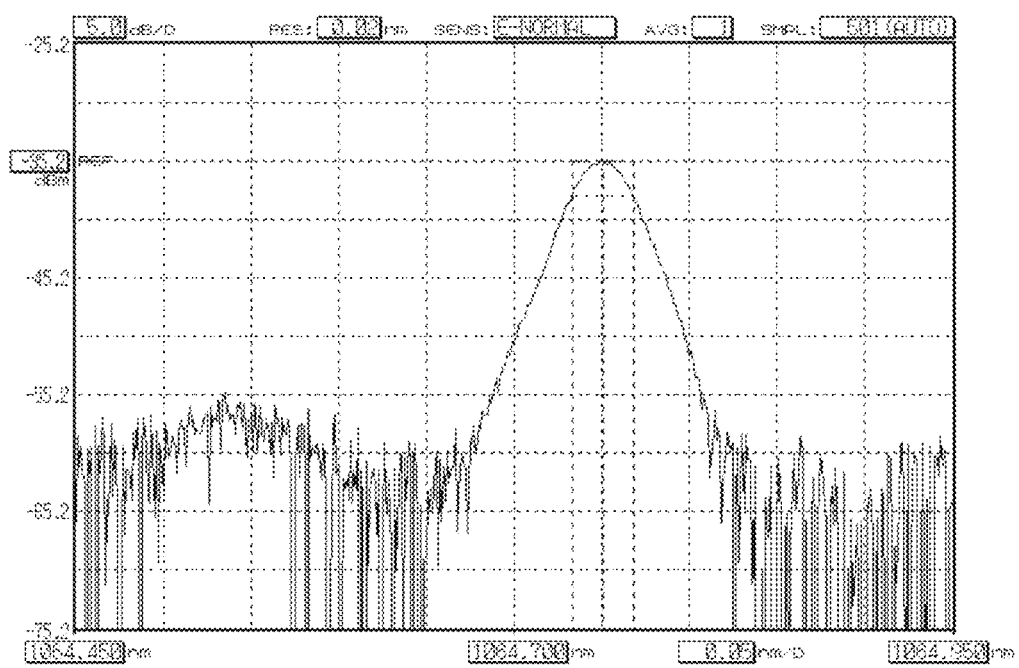

Fig.9
(a)
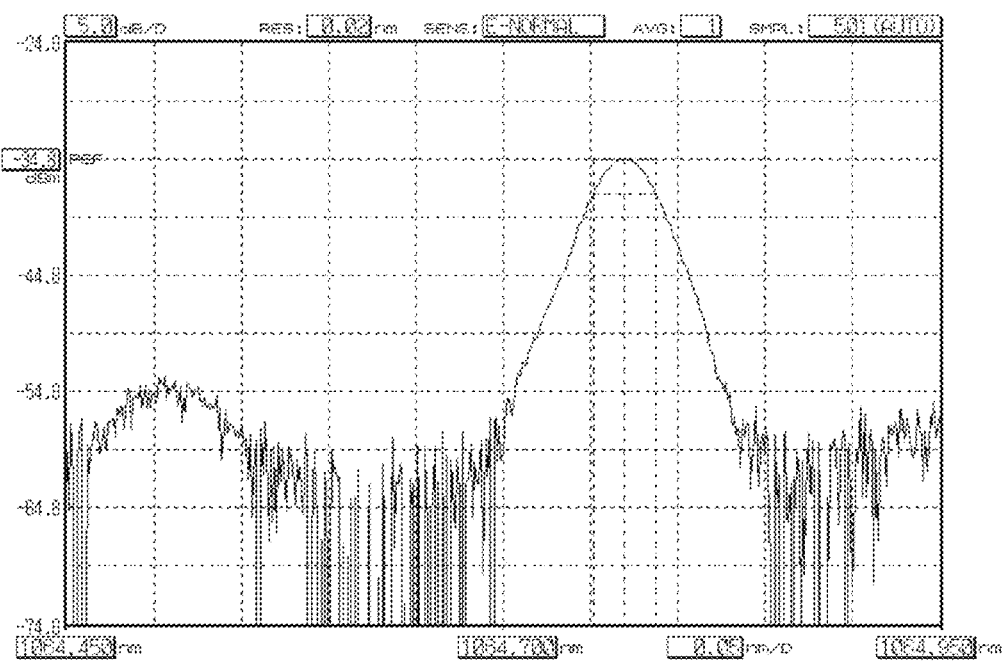
(b)
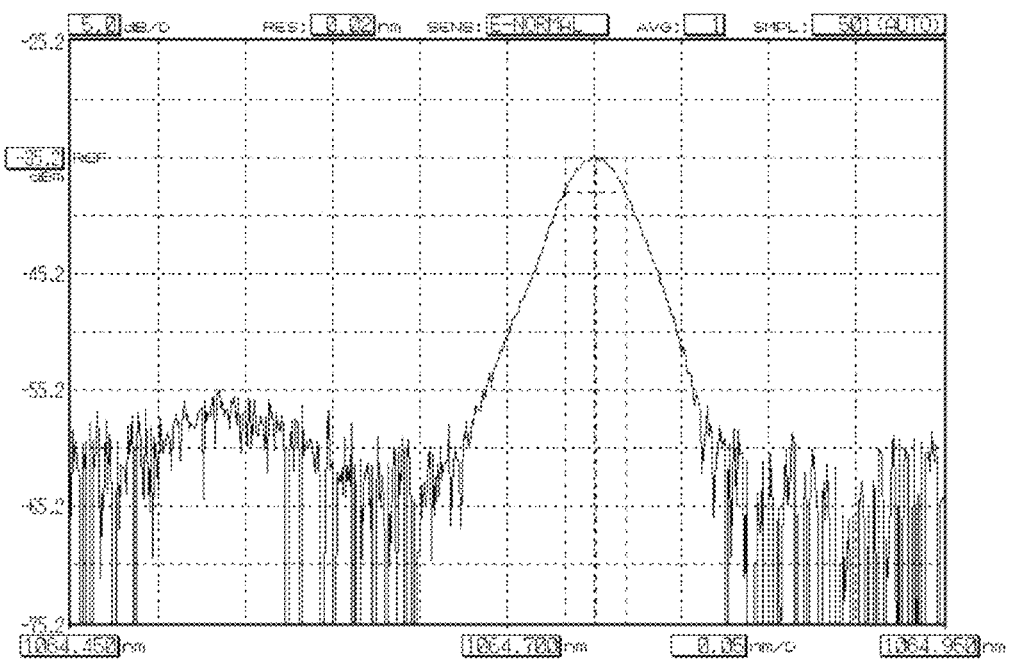

Fig.11
(a)
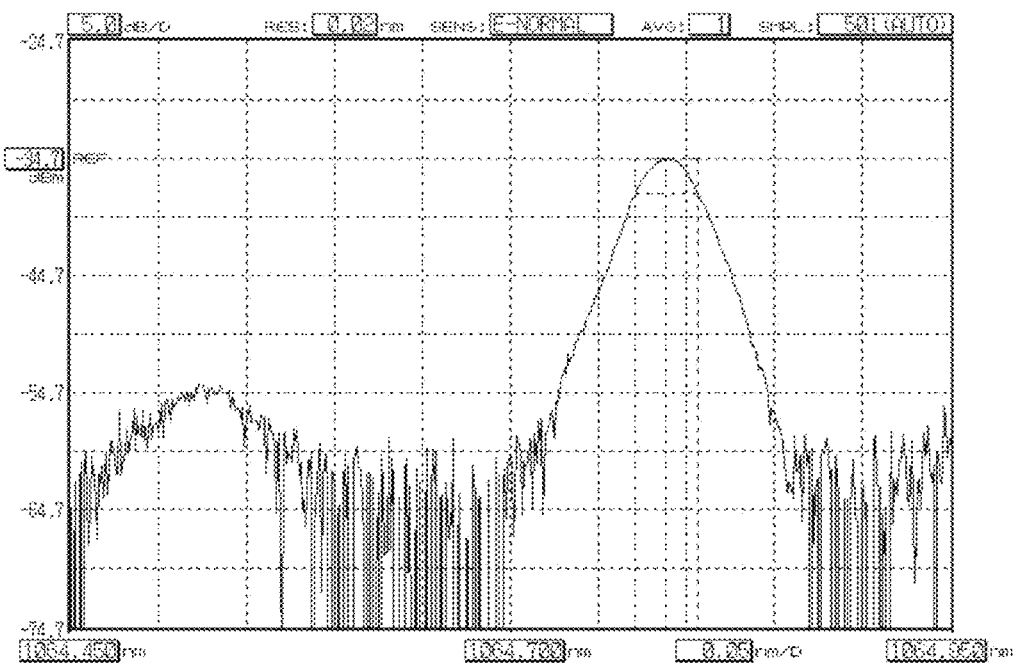
(b)
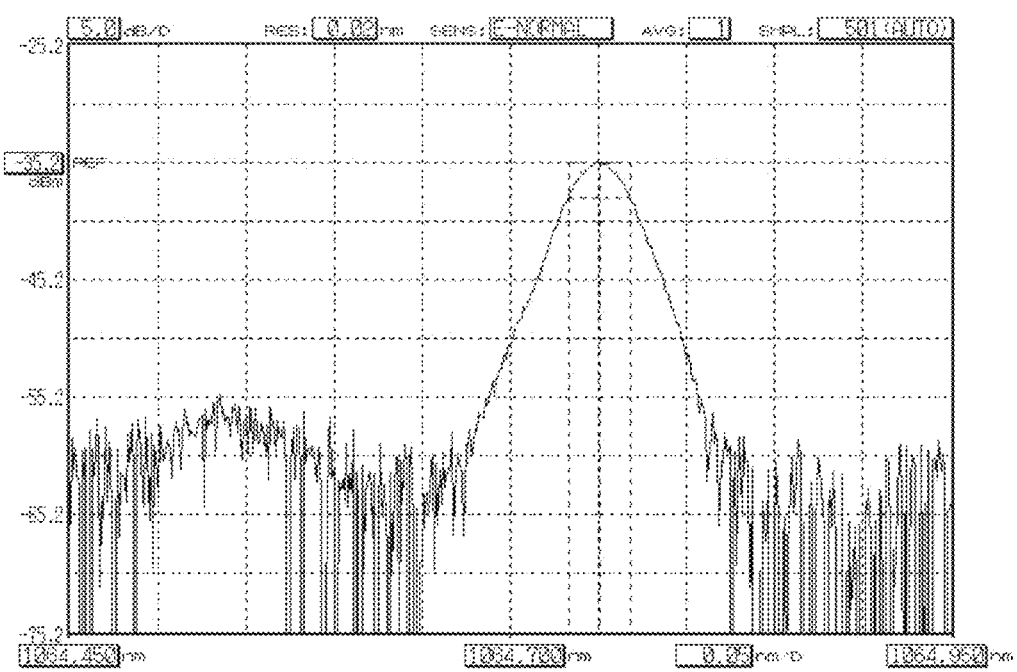

Fig.21
(a)
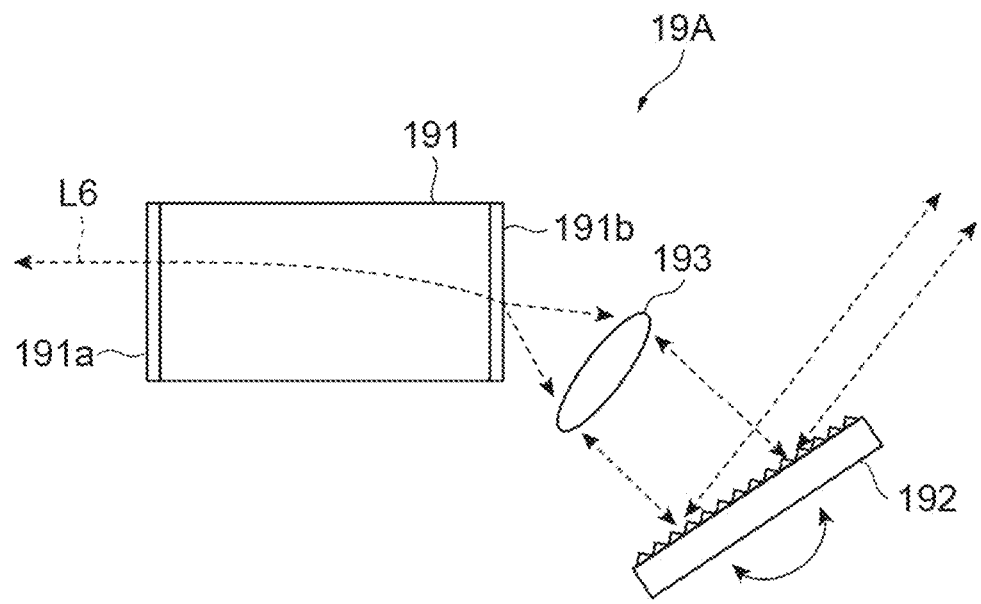
(b)
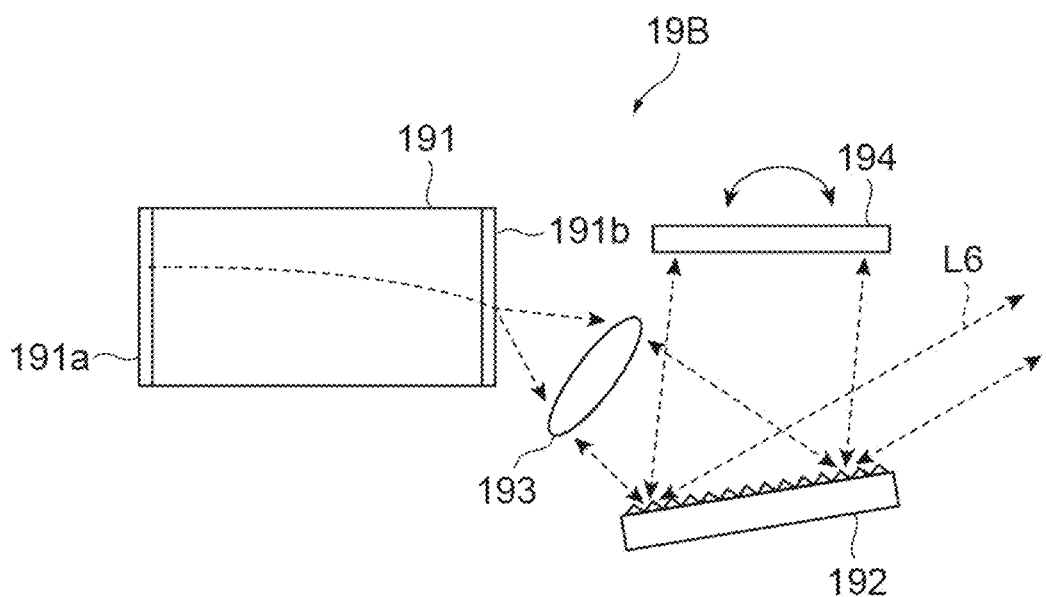

Fig.23
(a)
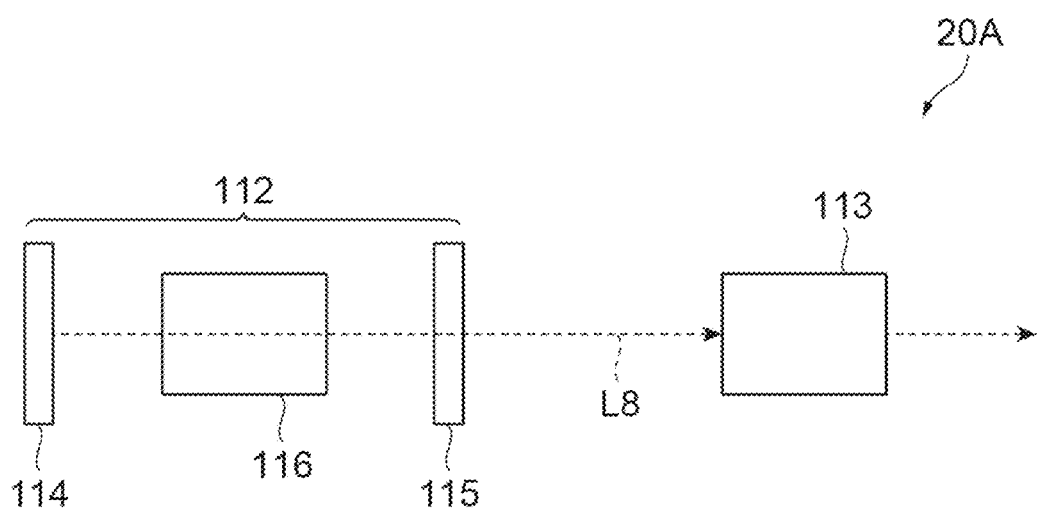
(b)
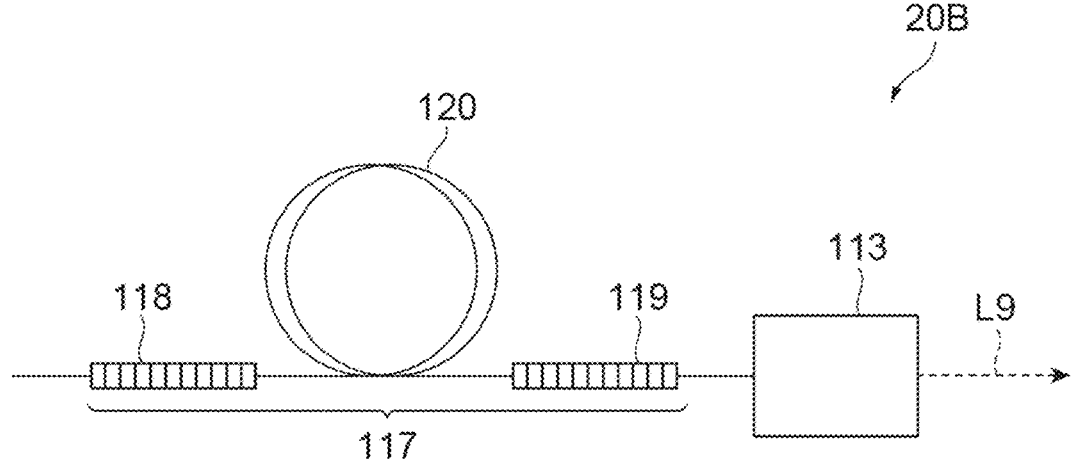

LASER DEVICE AND METHOD FOR GENERATING LASER LIGHT

TECHNICAL FIELD

The present disclosure relates to a laser apparatus and a laser light generation method.

BACKGROUND ART

Patent Document 1 describes a technique related to a programmable ultrafast burst mode laser for microfabrication. The laser apparatus described in this document includes a burst pulse laser and one or more optical amplifiers. The burst pulse laser emits a burst with three or more laser pulses defined by a selectively shaped burst envelope. The burst pulse laser is configured to selectively adjust time intervals between the three or more laser pulses in the burst envelope and a time width of the burst envelope. The one or more amplifiers amplify the group of the three or more laser pulses to obtain a desired shape of the burst envelope.

CITATION LIST

Patent Literature

Patent Document 1: Japanese Patent Application Laid-Open Publication No. 2012-515450

Non Patent Literature

Non Patent Document 1: Dong Mao et al., "Flexible high-repetition-rate ultrafast fiber laser", Scientific Reports 3, Art. 3223, pp. 1-5 (2013)

SUMMARY OF INVENTION

Technical Problem

Conventionally, for example, in the applications such as laser processing, a burst pulse in which strength change is repeated at an extremely short time width (for example, several 10 to several 100 picoseconds) is used in some cases. As a method of generating the above burst pulse, for example, a method of periodically cutting laser light from a laser light source that outputs continuous light by a high-speed optical switch or the like, a method of supplying a periodic pulse current to a semiconductor laser element, or the like can be considered. However, in these methods, there is a limit to the operation speed of the optical switch and the current supply circuit, and it is difficult to generate the burst pulse having a high repetition frequency of, for example, 1 GHz or more.

An object of an embodiment is to provide a laser apparatus and a laser light generation method capable of generating a burst pulse having a high repetition frequency of 1 GHz or more.

Solution to Problem

An embodiment is a laser apparatus. The laser apparatus includes a light source unit for outputting first laser light and second laser light having a wavelength different from that of the first laser light to different optical paths; and a light combining unit optically coupled to the light source unit, and for combining the first laser light and the second laser light to generate a burst pulse with a frequency according to a difference between the wavelength of the first laser light and the wavelength of the second laser light, and in the light source unit, the wavelengths of the first laser light and the second laser light are set in advance or settable such that the frequency of the burst pulse is a certain frequency (desired frequency), the certain frequency is 1 GHz or more.

An embodiment is a laser light generation method. The laser light generation method includes a first step of outputting first laser light and second laser light having a wavelength different from that of the first laser light to different optical paths; and a second step of combining the first laser light and the second laser light to generate a burst pulse with a frequency according to a difference between the wavelength of the first laser light and the wavelength of the second laser light, and in the first step, the wavelengths of the first laser light and the second laser light are set such that the frequency of the burst pulse is 1 GHz or more.

In the above laser apparatus and the laser light generation method, the first laser light and the second laser light output from the light source unit (in the first step) are combined by the light combining unit (in the second step). At this time, the first laser light and the second laser light interfere with each other. As a result, interference light having a period of strength change according to the wavelength difference between the first laser light and the second laser light is generated.

Even when the wavelengths of the first laser light and the second laser light are in a wavelength region such as a near infrared region (700 nm to 2500 nm), by setting the difference between the wavelength of the first laser light and the wavelength of the second laser light to, for example, about several picometers to several 10 picometers, the period of the strength change of the interference light can be set to 1 nanoseconds or less. Further, the above interference light may be regarded as the burst pulse having a repetition frequency of 1 GHz or more. That is, according to the laser apparatus and the laser light generation method described above, a burst pulse having a high repetition frequency of 1 GHz or more can be generated.

Advantageous Effects of Invention

According to the laser apparatus and the laser light generation method of the embodiments, it is possible to generate a burst pulse having a high repetition frequency of 1 GHz or more.

BRIEF DESCRIPTION OF DRAWINGS

FIG. 2 includes (a), (b) graphs showing an example of change in output wavelength due to temperature change of a semiconductor laser element 15.

FIG. 5 includes (a), (b) graphs showing other examples of the laser light L3 after the combining.

FIG. 7 includes (a), (b) graphs showing an example of spectra of the laser light L1 and the laser light L2 with wavelengths being adjusted to set a burst pulse frequency to 1 GHz.

FIG. 9 includes (a), (b) graphs showing an example of spectra of the laser light L1 and the laser light L2 with wavelengths being adjusted to set the burst pulse frequency to 5 GHz.

FIG. 11 includes (a), (b) graphs showing an example of spectra of the laser light L1 and the laser light L2 with wavelengths being adjusted to set the burst pulse frequency to 10 GHz.

FIG. 21 includes (a), (b) diagrams schematically illustrating configurations of light sources 19A and 19B as a fourth modification.

FIG. 23 includes (a), (b) diagrams schematically illustrating configurations of light sources 20A and 20B as a sixth modification.

DESCRIPTION OF EMBODIMENTS

Hereinafter, embodiments of a laser apparatus and a laser light generation method will be described in detail with reference to the accompanying drawings. In the description of the drawings, the same elements will be denoted by the same reference signs, and redundant description will be omitted.

Figure 1:
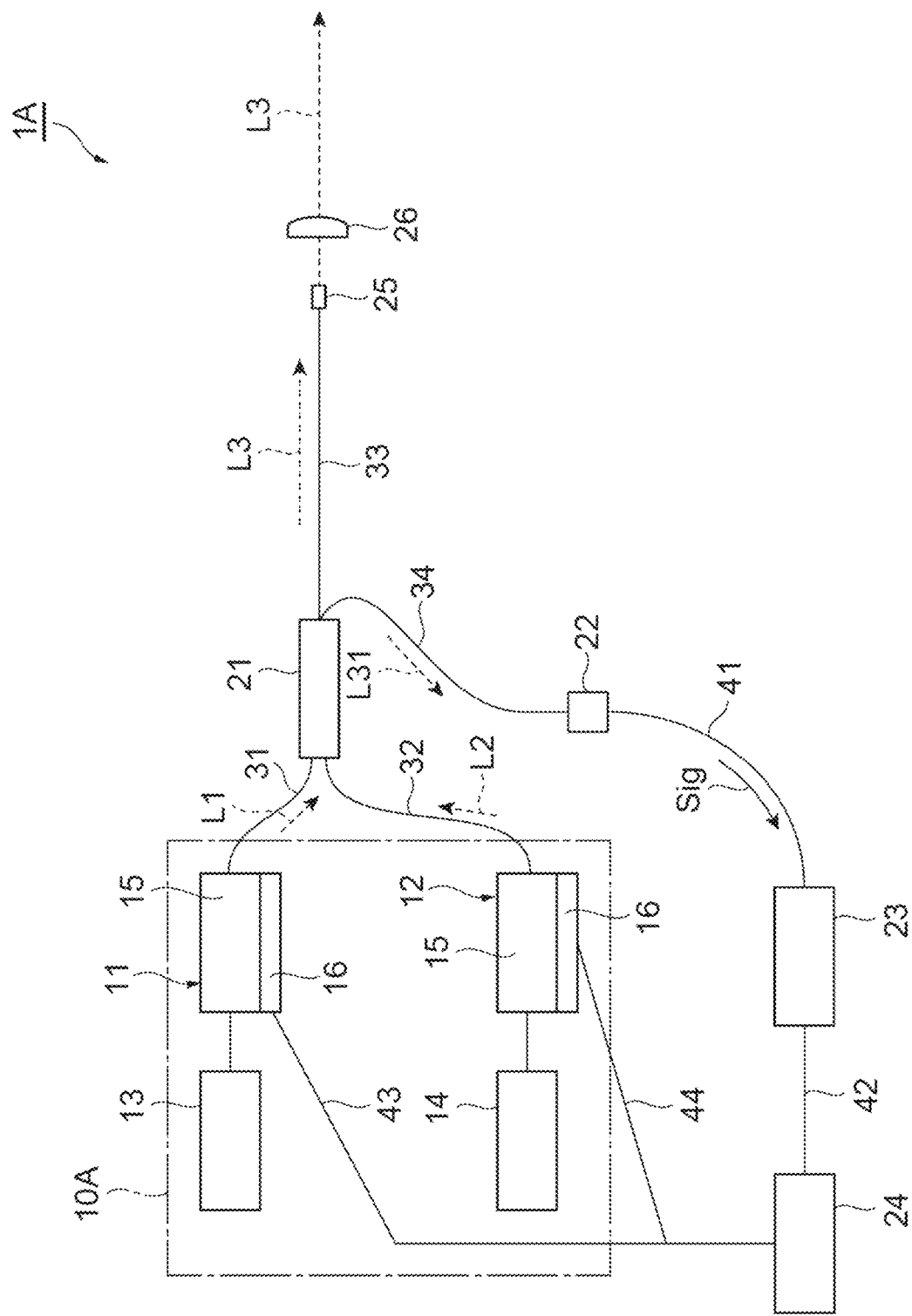
FIG. 1 is a diagram schematically illustrating a configuration of a laser apparatus 1A according to an embodiment.

FIG. 1 is a diagram schematically illustrating a configuration of a laser apparatus 1A according to an embodiment. The laser apparatus 1A is an apparatus for generating a burst pulse used in, for example, laser processing. As illustrated in FIG. 1, the laser apparatus 1A includes a light source unit 10A, a light combining unit 21, a photodetector 22, a frequency measurement unit 23, a temperature controlling computer 24, an optical fiber connector 25, and a collimator lens 26.

The light source unit 10A outputs laser light L1 (first laser light) and laser light L2 (second laser light). Specifically, the light source unit 10A includes laser light sources 11 and 12. Each of the laser light sources 11 and 12 includes, for example, a semiconductor laser element 15. The semiconductor laser element 15 is, for example, a distributed feedback (DFB) laser. The DFB laser includes a semiconductor substrate, and a diffraction grating layer and an active layer formed on the semiconductor substrate. In the diffraction grating layer, a periodic structure is formed along an optical resonating direction, and an oscillation wavelength is determined according to the period of the periodic structure. The above DFB laser can output laser light having an extremely narrow wavelength range.

In the light source unit 10A of the present embodiment, a wavelength of the laser light L1 and a wavelength of the laser light L2 are different from each other. The wavelength difference is realized by, for example, the periods of the periodic structures of the diffraction grating layers in the laser light sources 11 and 12 being different from each other. The difference between the wavelength of the laser light L1 and the wavelength of the laser light L2 is, for example when the frequency difference is 5 GHz, as small as about several picometers to 100 picometers, even when the laser light L1 and the laser light L2 are near infrared light (wavelength of 700 nm to 2500 nm).

The light source unit 10A further includes a drive circuit 13 for driving the semiconductor laser element 15 of the laser light source 11 and a drive circuit 14 for driving the semiconductor laser element 15 of the laser light source 12. The drive circuits 13 and 14 are electrically connected to anode electrodes and cathode electrodes of the semiconductor laser elements 15 of the laser light sources 11 and 12, respectively, and output currents for driving the semiconductor laser elements 15. These currents are not subjected to intensity modulation in which strength changes are repeated periodically, and have a temporally constant strength. In addition, back light of the semiconductor laser element 15 may be monitored, and the strength of the output current from each of the drive circuits 13 and 14 may be feedback-controlled based on the light intensity.

Each of the laser light sources 11 and 12 of the present embodiment constitutes a wavelength variable laser. For this purpose, each of the laser light sources 11 and 12 further includes a temperature control unit 16, in addition to the semiconductor laser element 15 described above. The temperature control unit 16 is constituted by a Peltier element on which the semiconductor laser element 15 is mounted, and changes a temperature of the semiconductor laser element 15 according to an electric signal supplied from the outside of the light source unit 10A. More preferably, a temperature sensor may be provided near the semiconductor laser element 15, and the strength of the electric signal to the temperature control unit 16 may be feedback-controlled based on a signal from the temperature sensor.

When the temperature of the semiconductor laser element 15 is changed by the temperature control unit 16, the period of the periodic structure is changed by expansion or contraction of the diffraction grating layer, and as a result, the oscillation wavelength of the semiconductor laser element 15 is changed and the output wavelength is changed. The temperature of the semiconductor laser element 15 is changed in units of 0.01° C., for example, and in this case, the output wavelength can be changed in units of 1 picometer.

(a) and (b) in FIG. 2 are graphs showing an example of change in output wavelength due to temperature change of the semiconductor laser element 15. In these graphs, the vertical axis represents a light intensity (arb. unit), and the horizontal axis represents a wavelength (unit: nanometer). In this example, at the temperature of 25.0° C., the center wavelength is 1064.9 nm as shown in (a) in FIG. 2, and at the temperature of 20.3° C., the center wavelength is 1064.2 nm as shown in (b) in FIG. 2. In addition, the configuration of the light source unit 10A is not limited to this, and any configuration may be provided as long as it is wavelength variable.

The light source unit 10A outputs the laser light L1 output from the laser light source 11 and the laser light L2 output from the laser light source 12 to different optical paths (optical fibers 31 and 32). Specifically, one end of the optical fiber 31 is optically coupled to the semiconductor laser element 15 of the laser light source 11, and one end of the optical fiber 32 is optically coupled to the semiconductor laser element 15 of the laser light source 12. The other ends of the optical fibers 31 and 32 are coupled to input ends of a 2-input 2-output optical coupler as the light combining unit 21. The laser light L1 and the laser light L2 are combined with each other in the light combining unit 21, and output from one output end of the optical coupler as laser light L3 including a burst pulse.

Figure 3:
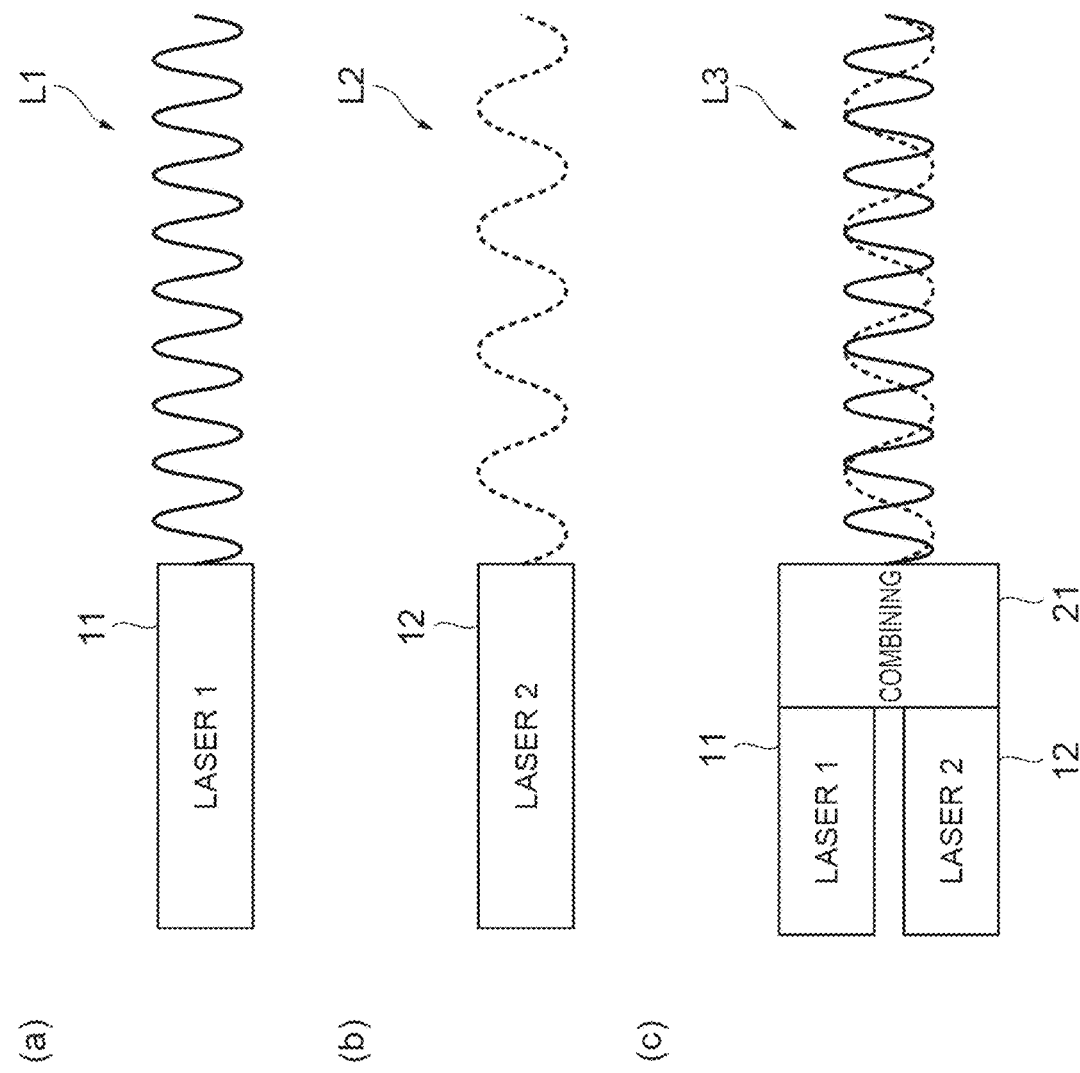
FIG. 3 includes (a)-(c) diagrams conceptually illustrating laser light L1 and laser light L2 before the combining and laser light L3 after the combining FIG. 4 includes (a)-(c) diagrams illustrating an example of waveform control of the laser light L1 and the laser light L2.

The light combining unit 21 coaxially combines the laser light L1 and the laser light L2, and generates the burst pulse with a frequency according to a difference between the wavelength of the laser light L1 and the wavelength of the laser light L2. In addition, (a) to (c) in FIG. 3 are diagrams conceptually illustrating the laser light L1 and the laser light L2 before the combining and the laser light L3 after the combining (a) in FIG. 3 illustrates the laser light L1 before the combining as a light wave, and (b) in FIG. 3 illustrates the laser light L2 before the combining as a light wave. Periods of waveforms illustrated in these diagrams represent the wavelengths of the laser light L1 and the laser light L2.

As illustrated in (a) and (b) in FIG. 3, the wavelengths of the laser light L1 and the laser light L2 are different from each other. When the laser light L1 and the laser light L2 are combined, as shown in (c) in FIG. 3, the laser light L1 and the laser light L2 overlap and interfere with each other. Further, the light intensity waveform $e_1(t)$ of the laser light L1 can be expressed by the following Formula (1), and the light intensity waveform $e_2(t)$ of the laser light L2 can be expressed by the following Formula (2). In addition, in the Formulas, A is an amplitude, $f_1$ is a frequency of the laser light L1, $f_2$ is a frequency of the laser light L2, $\phi_1$ is a phase of the laser light L1, and $\phi_2$ is a phase of the laser light L2.

[Formula 1]

$$e_1(t)=A\cos(2\pi f_1 t+\phi_1) \quad (1)$$

[Formula 2]

$$e_2(t)=A\cos(2\pi f_2 t+\phi_2) \quad (2)$$

In this case, the light intensity waveform I(t) of the laser light L3 after the combining is expressed by the following Formula (3).

[Formula 3]

$$I(t) \propto A^2(1+\cos[2\pi(f_2-f_1)t+(\phi_2-\phi_1)]) \quad (3)$$

The right side of the above Formula (3) contains a term of a difference frequency $(f_2-f_1)$. The difference frequency $(f_2-f_1)$ is a beat frequency of the burst pulse included in the laser light L3. Therefore, the beat frequency of the burst pulse decreases as the frequencies $f_1$ and $f_2$ of the laser light L1 and the laser light L2 are closer to each other, and the beat frequency of the burst pulse increases as the frequencies $f_1$ and $f_2$ are farther from each other.

Referring again to FIG. 1. The one output end of the optical coupler as the light combining unit 21 is optically coupled to one end of an optical fiber 33. The laser light L3 generated in the light combining unit 21 propagates through the optical fiber 33. The optical fiber connector 25 is attached to the other end of the optical fiber 33. The optical fiber connector 25 terminates the optical fiber 33. That is, the light passing through the optical fiber 33 reaches the optical fiber connector 25 and is then output to the space.

The collimator lens 26 is optically coupled to the optical fiber connector 25 via the space, and collimates the light radially output from the optical fiber connector 25. The laser light L3 passing through the collimator lens 26 is output to the outside of the laser apparatus 1A. For example, when the laser apparatus 1A is a laser processing apparatus, a processing object is irradiated with the collimated laser light L3. In addition, in FIG. 1, the light propagating through the space is indicated by the dashed line.

The other output end of the optical coupler as the light combining unit 21 is optically coupled to the photodetector 22 via an optical fiber 34. From the other output end, light L31 being a part of the laser light L3 is output, and the light L31 is input to the photodetector 22. The ratio of the light intensity of the laser light L3 output from the one output end of the optical coupler and the light intensity of the light L31 is, for example, 99:1. The photodetector 22 generates and outputs an electric signal Sig according to the light intensity of the light L31. The photodetector 22 may be constituted by, for example, a photodiode or a biplanar phototube.

The frequency measurement unit 23 is electrically connected to the photodetector 22 via a wiring line 41, and the frequency measurement unit 23 inputs the electric signal Sig from the photodetector 22 to measure frequency. The frequency measurement unit 23 may be constituted by, for example, a spectrum analyzer. The temperature controlling computer 24 is electrically connected to the frequency measurement unit 23 and the temperature control units 16 of the laser light sources 11 and 12 via wiring lines 42 to 44. The temperature controlling computer 24 controls the temperature control units 16 of the laser light sources 11 and 12 to adjust the difference frequency $(f_2-f_1)$ such that the frequency measured by the frequency measurement unit 23 approaches the desired frequency.

The temperature controlling computer 24 may be constituted by a computer including, for example, a central processing unit (CPU), a main storage device (RAM), and an auxiliary storage device (ROM or hard disk). A temperature controlling program is stored in the auxiliary storage device, and the CPU reads out the program to perform predetermined temperature control processing.

In the light source unit 10A, the wavelengths of the laser light L1 and the laser light L2 (that is, frequencies $f_1$ and $f_2$) are set in advance or settable such that the frequency of the burst pulse is a certain desired frequency (predetermined frequency). When the frequency of the burst pulse is set in advance, the frequency is stored in advance in the auxiliary storage device of the temperature controlling computer 24, and the temperature controlling computer 24 controls the temperatures of the semiconductor laser elements 15 such that the frequency of the burst pulse approaches the frequency.

Further, when the frequency of the burst pulse is settable, the frequency is input to the temperature controlling computer 24 by an operator or a frequency setting computer, and the temperature controlling computer 24 controls the temperatures of the semiconductor laser elements 15 such that the frequency of the burst pulse approaches the frequency. Therefore, for example, the frequency of the burst pulse may be dynamically changed according to the state of the laser processing object.

In the present embodiment, the burst pulse frequency set in advance (or settable) is 1 GHz or more. When it is less than 1 GHz, as described above, it can be realized by a method of periodically cutting laser light from a laser light source outputting continuous light by a high-speed optical switch or the like, a method of supplying a periodic pulse current to a semiconductor laser element, or the like. The laser apparatus 1A of the present embodiment realizes a burst pulse frequency of 1 GHz or more, which cannot be realized by these methods.

Further, the burst pulse frequency set in advance (or settable) may be 2000 GHz or less. The laser apparatus 1A of the present embodiment combines the laser light L1 and the laser light L2 having extremely close frequencies to enable generation of the interference light at an extremely low frequency of 2000 GHz or less, and uses it as a burst pulse. Further, the burst pulse frequency set in advance (or settable) may be 1000 GHz or less, or may be 100 GHz or less. According to the laser apparatus 1A of the present embodiment, in principle, it is possible to generate a burst pulse having such an extremely low frequency.

The following Table 1 is a table showing a relationship between the wavelength difference $\Delta\lambda$ and the difference frequency $\Delta f = f_2 - f_1$ (that is, burst pulse frequency), when the wavelength band $\lambda$ of the laser light L1 and the laser light L2 is 1064 nm. When the wavelength is $\lambda$, the frequency f is given by $f = c/\lambda$ (here, c is the high speed). Further, the relational expression between the difference frequency $\Delta f$ and the wavelength difference $\Delta\lambda$ is expressed by the following Formula (4).

TABLE 1

| wavelength difference $\Delta\lambda$ (nm) | difference frequency $\Delta f$ (GHz) |
|---|---|
| 0.00377 | 1 |
| 0.01887 | 5 |
| 0.03774 | 10 |
| 0.37737 | 100 |
| 3.7737 | 1000 |

[Formula 4]

$$\Delta\lambda = \frac{\lambda^2}{c} \cdot \Delta f \quad (4)$$

The drive circuits 13 and 14 also serve as a waveform control unit in the present embodiment. That is, the drive circuits 13 and 14 control temporal waveforms of supply currents to the semiconductor laser elements 15 to control the waveforms of the laser light L1 and the laser light L2 before the combining to be waveforms identical to each other. For this purpose, the laser apparatus 1A may further include a control unit (not illustrated) for totally controlling operations of the drive circuits 13 and 14 as a part of the waveform control unit. The control unit may be constituted by a computer including a CPU, a RAM, and a ROM (or a hard disk). A laser driving program is stored in the ROM (or the hard disk), and the CPU reads out the program to perform predetermined laser driving processing.

Figure 4:
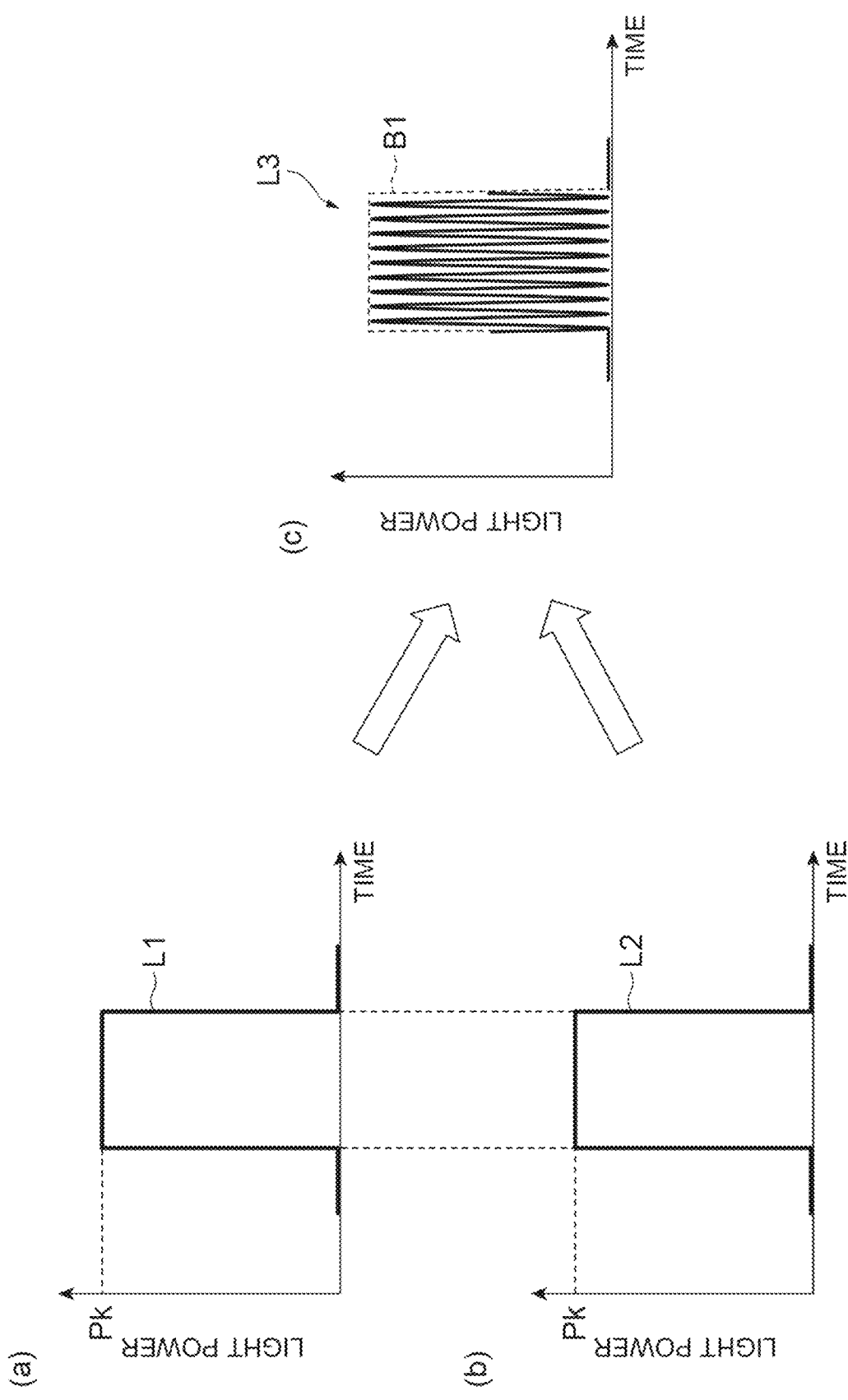

(a) to (c) in FIG. 4 are diagrams illustrating an example of waveform control of the laser light L1 and the laser light L2. In these diagrams, the vertical axis represents a light intensity (light power), and the horizontal axis represents a time. The laser light L1 and the laser light L2 are output as rectangular waves having steep rising and falling edges and a flat top, for example as shown in (a) and (b) in FIG. 4. The rising timings of the laser light L1 and the laser light L2 are coincident (synchronized) with each other, and the falling timings are also coincident (synchronized) with each other. Further, the peak intensities Pk of the laser light L1 and the laser light L2 may be equal to each other or may be different from each other. When the laser light L1 and the laser light L2 are combined, as shown in (c) in FIG. 4, the laser light L3 including the burst pulse with the range defined by an envelope B1 of a rectangular wave shape is generated.

(a) and (b) in FIG. 5 are graphs showing other examples of the laser light L3 after the combining. In these graphs, the vertical axis represents a light intensity (light power), and the horizontal axis represents a time. For example as shown in (a) in FIG. 5, the laser light L3 may include the burst pulse with the range defined by an envelope B2 of a Gaussian wave shape. Further, as shown in (b) in FIG. 5, the laser light L3 may include the burst pulse with the range defined by an envelope B3 of a triangular wave shape with a slow rising edge and a steep falling edge. For example, as in these examples, according to the laser apparatus 1A of the present embodiment, a burst pulse having an arbitrary envelope can be easily generated.

Figure 6:
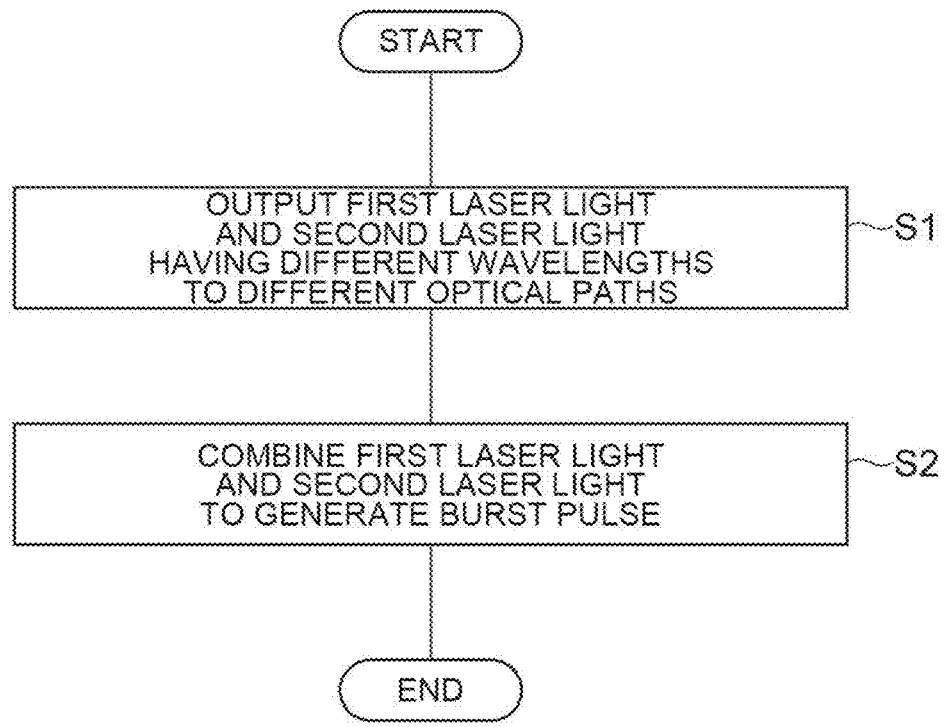
FIG. 6 is a flowchart illustrating a laser light generation method of an embodiment.

FIG. 6 is a flowchart illustrating a laser light generation method of the present embodiment. The laser light generation method can be realized by using, for example, the laser apparatus 1A described above. First, in a first step S1, the laser light L1 and the laser light L2 having the wavelength different from that of the laser light L1 are output respectively to the different optical paths (optical fibers 31 and 32). The first step S1 is performed by, for example, the light source unit 10A.

Next, in a second step S2, the laser light L1 and the laser light L2 are combined to generate the burst pulse with the frequency $\Delta f$ according to the difference $\Delta\lambda$ between the wavelength of the laser light L1 and the wavelength of the laser light L2. The second step S2 is performed by, for example, the light combining unit 21. Further, in the first step S1, the wavelengths of the laser light L1 and the laser light L2 are set such that the frequency $\Delta f$ of the burst pulse is 1 GHz or more.

Effects obtained by the laser apparatus 1A and the laser light generation method of the present embodiment described above will be described. In the present embodiment, the laser light L1 and the laser light L2 output from the light source unit 10A (in the first step S1) are combined by the light combining unit 21 (in the second step S2). At this time, the laser light L1 and the laser light L2 interfere with each other. As a result, the interference light having a period of strength change according to the wavelength difference between the laser light L1 and the laser light L2 is generated.

Even when the wavelengths of the laser light L1 and the laser light L2 are in a wavelength region such as a near infrared region (700 nm to 2500 nm), when the difference between the wavelength of the laser light L1 and the wavelength of the laser light L2 is set to, for example, about several picometers to several 10 picometers, the period of strength change in the interference light can be set to 1 nanosecond or less. Further, the interference light may be regarded as the burst pulse having the repetition frequency of 1 GHz or more. That is, according to the laser apparatus 1A and the laser light generation method of the present embodiment, it is possible to generate a burst pulse having a high repetition frequency of 1 GHz or more.

As in the present embodiment, the repetition frequency of the burst pulse frequency may be 2000 GHz or less, 1000 GHz or less, or 100 GHz or less. When the repetition frequency of the light pulse train is too high, it is regarded as continuous light rather than the burst pulse, and further, by suppressing the repetition frequency of the light pulse train to such an extent, a burst pulse that can be suitably used for, for example, laser processing can be generated.

As in the present embodiment, in the light source unit 10A, the wavelengths of the laser light L1 and the laser light L2 may be variable. In this case, the repetition frequency Δf of the burst pulse can be accurately controlled by feedback control. Further, the repetition frequency Δf of the burst pulse can be made variable, and the irradiation conditions can be easily changed in laser processing or the like. In addition, in the present embodiment, both the wavelengths of the laser light L1 and the laser light L2 are variable, but the same effect can be obtained even when only one of the wavelengths of the laser light L1 and the laser light L2 is variable.

As in the present embodiment, the laser light sources 11 and 12 may be wavelength variable lasers. In this case, the configuration in which the wavelengths of the laser light L1 and the laser light L2 are variable can be easily realized. In addition, as described above, only one of the wavelengths of the laser light L1 and the laser light L2 may be variable, and in this case, only one of the laser light sources 11 and 12 may be a wavelength variable laser. That is, the temperature control unit 16 may be provided for only one of the laser light sources 11 and 12.

As in the present embodiment, each of the laser light sources 11 and 12 may include the semiconductor laser element 15 being the DFB laser and the temperature control unit 16 for changing the temperature of the semiconductor laser element 15 according to the electric signal. For example by the above configuration, a wavelength variable laser capable of changing a wavelength in units of 1 picometer can be easily realized.

As in the present embodiment, the laser apparatus 1A may include the waveform control unit (drive circuits 13 and 14) for controlling the waveforms of the laser light L1 and the laser light L2 before the combining to be waveforms identical to each other. In this case, the shape of the envelope of the burst pulse output from the light combining unit 21 (see (c) in FIG. 4, (a) and (b) in FIG. 5) can be controlled. Further, when the light source unit 10A includes the semiconductor laser element 15 as in the present embodiment, the waveform control unit (drive circuits 13 and 14) may control the temporal waveform of the supply current to the semiconductor laser element 15. In this case, an optical component for shaping the waveform is not necessary, and thus, the configuration of the laser apparatus 1A can be simplified.

In addition, Non Patent Document 1 discloses a burst pulse generation apparatus in which a Mach-Zehnder interferometer (MZI) is incorporated in a resonator of a mode-locked fiber oscillator, and an element for a variable optical path length is provided at one resonator end. By adjusting the optical path difference, the MZI acts as a spectral filter, a spectral distribution of the mode-locked oscillation (in which spectral peaks are provided with equal intervals) is filtered, and high repetition pulses are generated by interference of passed modes.

However, in the above method of adjusting the spectral interval by adjusting the optical path difference of the interferometer, the spectral interval greatly varies due to a slight change in the optical path difference. As a result, precise adjustment in a region exceeding 1100 GHz is difficult. On the other hand, in the configuration of the present embodiment, in principle, it is possible to adjust accurately even in a region with the burst pulse frequency of 1100 GHz or more.

Further, for example, when the burst pulse frequency of 1000 GHz or more is to be realized by a mode-locked laser, an extremely short resonator length of 100 μm or less is required, but it is extremely difficult to realize such a small optical resonator. Further, even when it is realized, a length of a gain medium in a resonating direction becomes extremely short, and thus, the obtained light output becomes extremely small, which is not suitable for applications such as laser processing. On the other hand, in the configuration of the present embodiment, even the burst pulse frequency of 1000 GHz or more can be easily realized, and the light output having a sufficient strength can be obtained.

Further, as another method for generating the burst pulse, there is a method of providing a saturable absorption element such as graphene in a resonator, however, even when the resonator length is minimized with realistic dimensions and graphene is used in the form of a film, the achievable repetition frequency is at most 10 to 20 GHz. In the configuration of the present embodiment, the burst pulse frequency exceeding 20 GHz can be realized.

EXAMPLE

An example of the above embodiment will now be described. (a) and (b) in FIG. 7 are graphs showing an example of spectra of the laser light L1 and the laser light L2 with wavelengths being adjusted to set the burst pulse frequency to 1 GHz. (a) in FIG. 7 shows the spectrum of the laser light L1, and (b) in FIG. 7 shows the spectrum of the laser light L2. The center wavelength of the laser light L1 is 1064.755 nm (frequency $f_1$=281.755 THz), and the temperature of the semiconductor laser element 15 of the laser light source 11 is 23.37° C. Further, the center wavelength of the laser light L2 is 1064.751 nm (frequency $f_2$=281.756 THz), and the temperature of the semiconductor laser element 15 of the laser light source 12 is 26.01° C.

Figure 8:
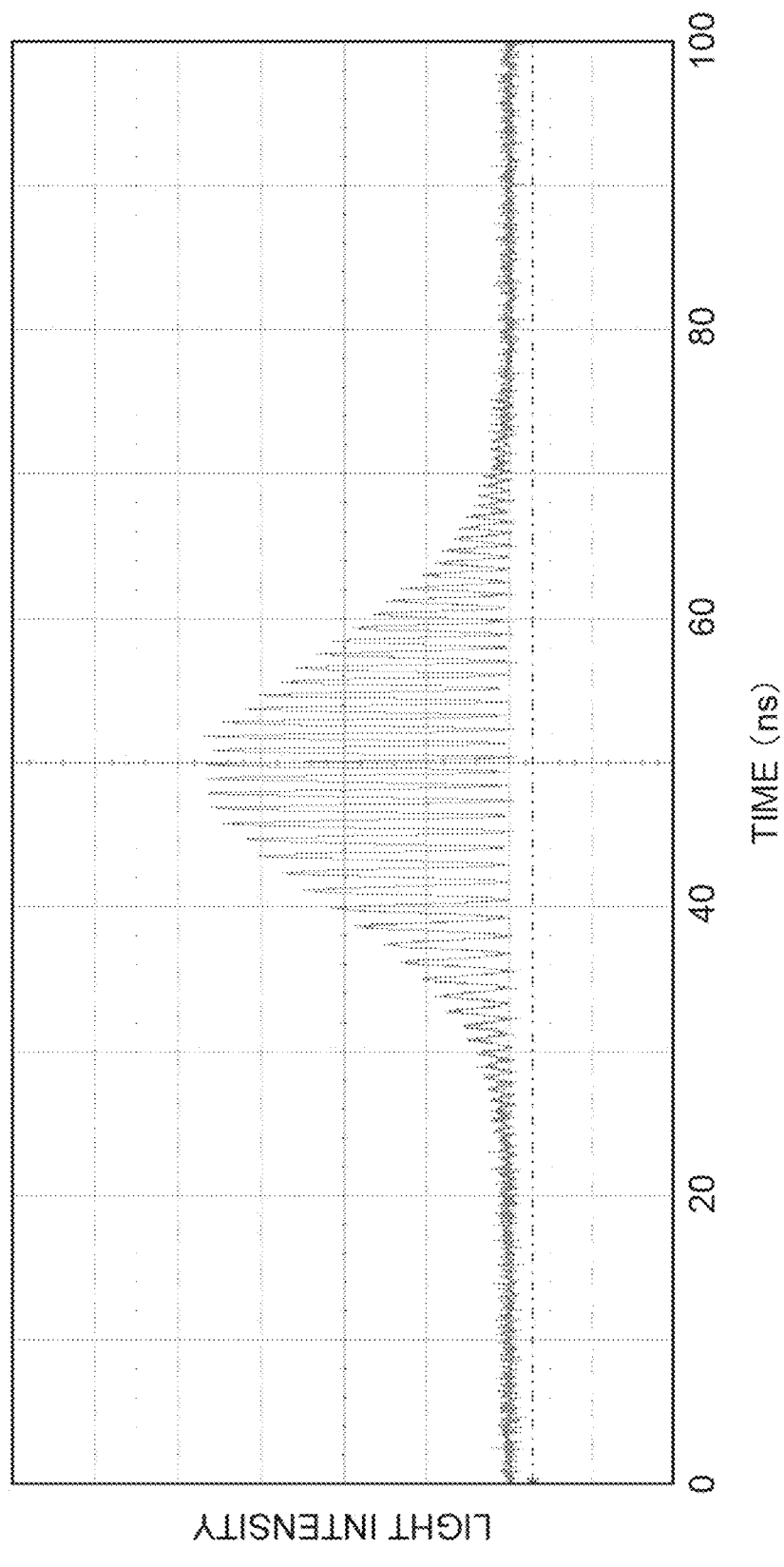
FIG. 8 is a graph showing a burst pulse generated in the example.

FIG. 8 is a graph showing the burst pulse generated in the present example. In FIG. 8, the vertical axis represents a light intensity, and the horizontal axis represents a time. In this graph, the burst pulse frequency Δf is $f_1-f_2$=1 GHz, and the pulse width is 500 picoseconds. Since the temporal waveforms of the laser light L1 and the laser light L2 have a Gaussian wave shape, the envelope of the burst pulse also has a Gaussian wave shape.

(a) and (b) in FIG. 9 are graphs showing an example of spectra of the laser light L1 and the laser light L2 with wavelengths being adjusted to set the burst pulse frequency to 5 GHz. (a) in FIG. 9 shows the spectrum of the laser light L1, and (b) in FIG. 9 shows the spectrum of the laser light L2. The center wavelength of the laser light L1 is 1064.770 nm (frequency $f_1$=281.751 THz), and the temperature of the semiconductor laser element 15 of the laser light source 11 is 23.57° C. Further, the center wavelength of the laser light L2 is 1064.751 nm (frequency $f_2$=281.756 THz), and the temperature of the semiconductor laser element 15 of the laser light source 12 is 26.01° C.

Figure 10:
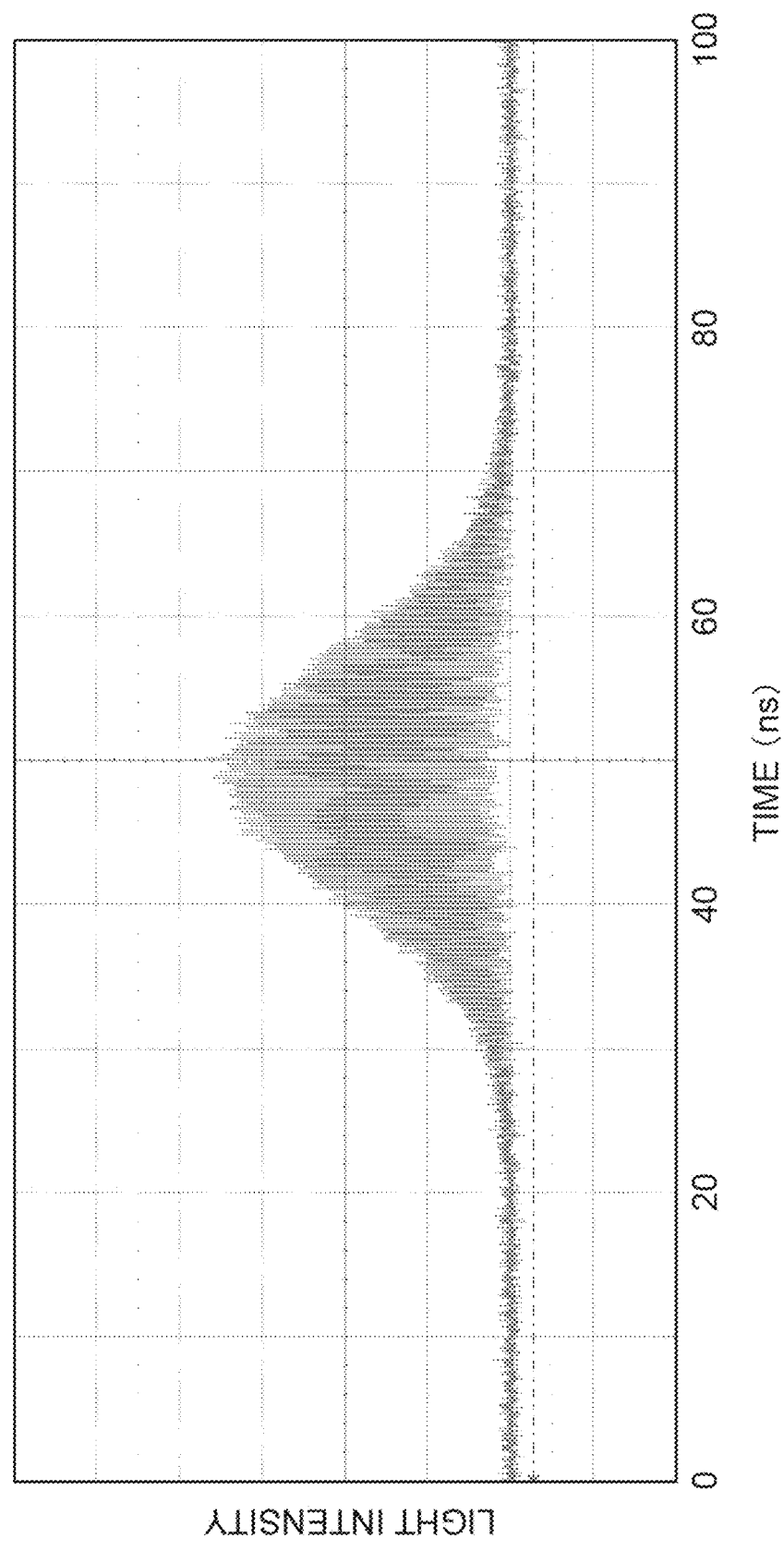
FIG. 10 is a graph showing the burst pulse generated in the example.

FIG. 10 is a graph showing the burst pulse generated in the present example. In FIG. 10, the vertical axis represents a light intensity, and the horizontal axis represents a time. In this graph, the burst pulse frequency Δf is $f_1-f_{2=5}$ GHz, and the pulse width is 100 picoseconds.

(a) and (b) in FIG. 11 are graphs showing an example of spectra of the laser light L1 and the laser light L2 with wavelengths being adjusted to set the burst pulse frequency to 10 GHz. (a) in FIG. 11 shows the spectrum of the laser light L1, and (b) in FIG. 11 shows the spectrum of the laser light L2. The center wavelength of the laser light L1 is 1064.789 nm (frequency $f_1$=281.746 THz), and the temperature of the semiconductor laser element 15 of the laser light source 11 is 23.83° C. Further, the center wavelength of the laser light L2 is 1064.751 nm (frequency $f_2$=281.756 THz), and the temperature of the semiconductor laser element 15 of the laser light source 12 is 26.01° C.

Figure 12:
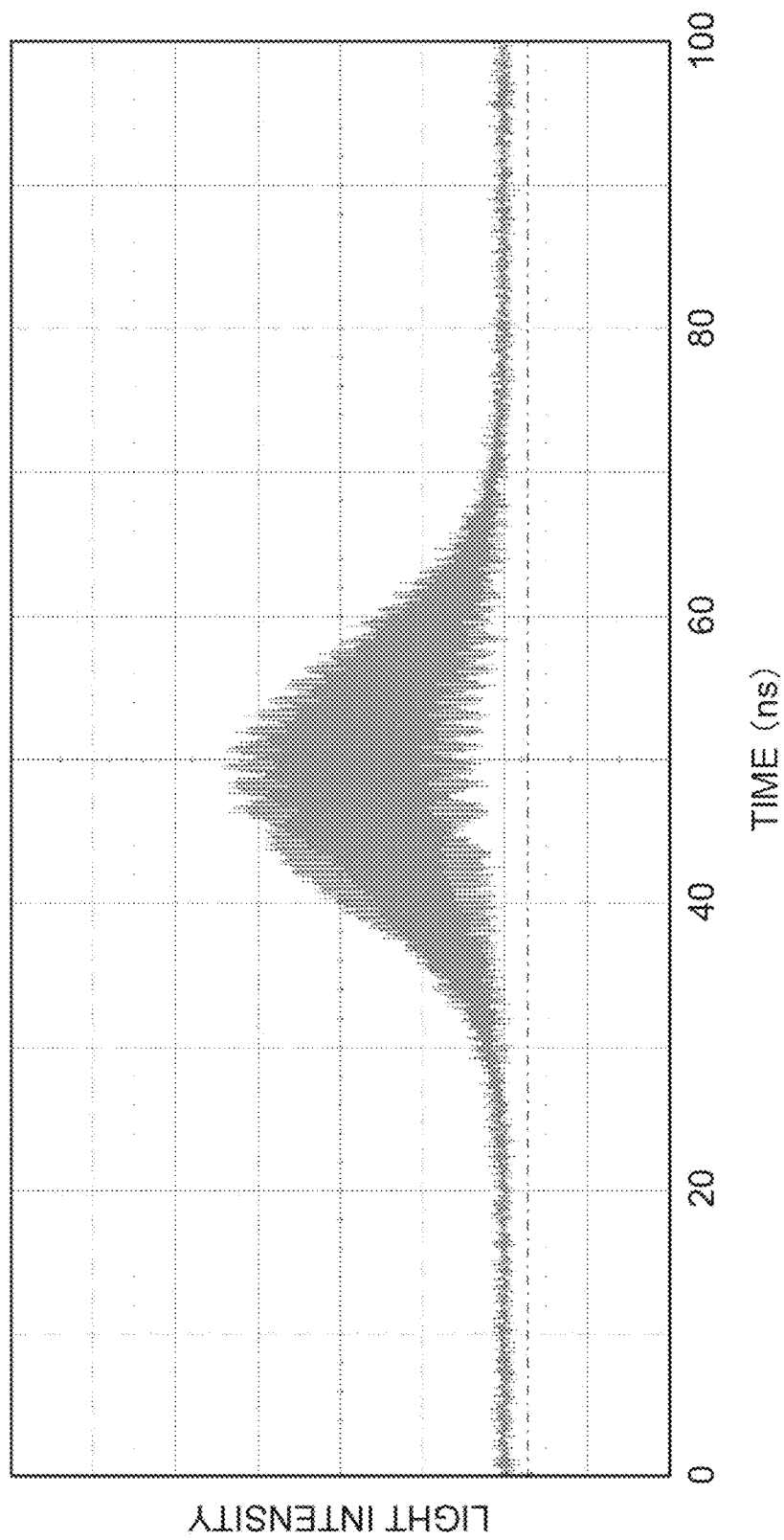
FIG. 12 is a graph showing the burst pulse generated in the example.
Figure 13:
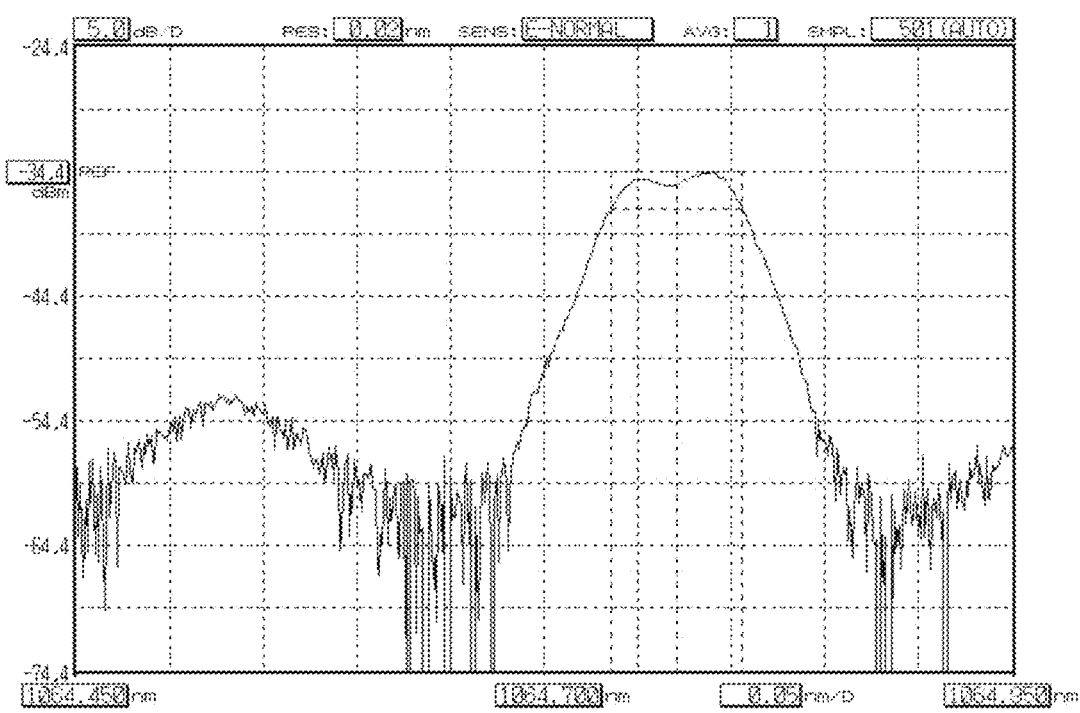
FIG. 13 is a graph showing a spectrum of the laser light L3 including the burst pulse.

FIG. 12 is a graph showing the burst pulse generated in the present example. In FIG. 12, the vertical axis represents a light intensity, and the horizontal axis represents a time. In this graph, the burst pulse frequency $\Delta f$ is $f_1-f_2$=10 GHz, and the pulse width is 50 picoseconds. FIG. 13 is a graph showing a spectrum of the laser light L3 including the burst pulse.

Figure 14:
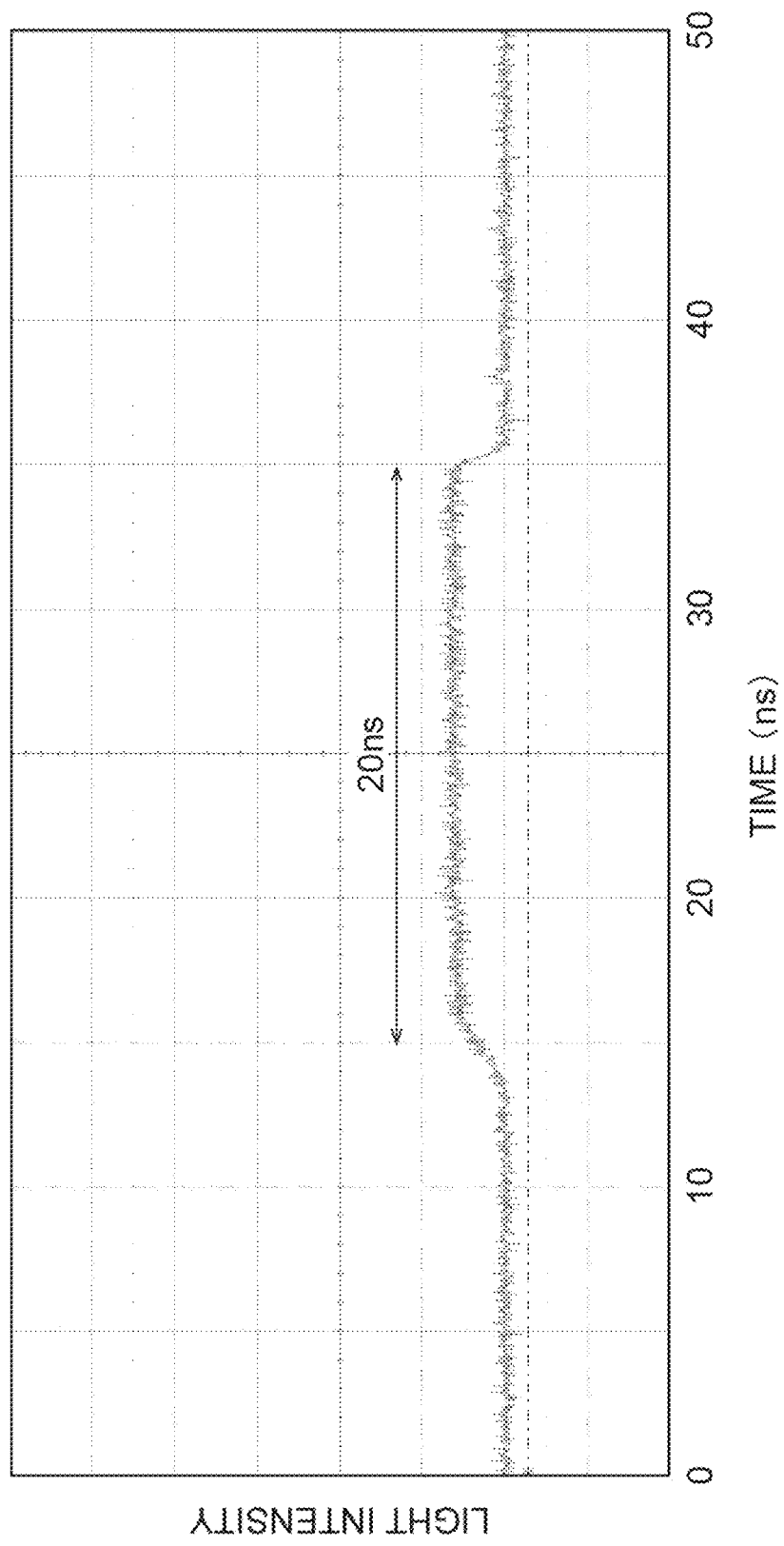
FIG. 14 is a graph showing a temporal waveform of the laser light L1 in another example.
Figure 15:
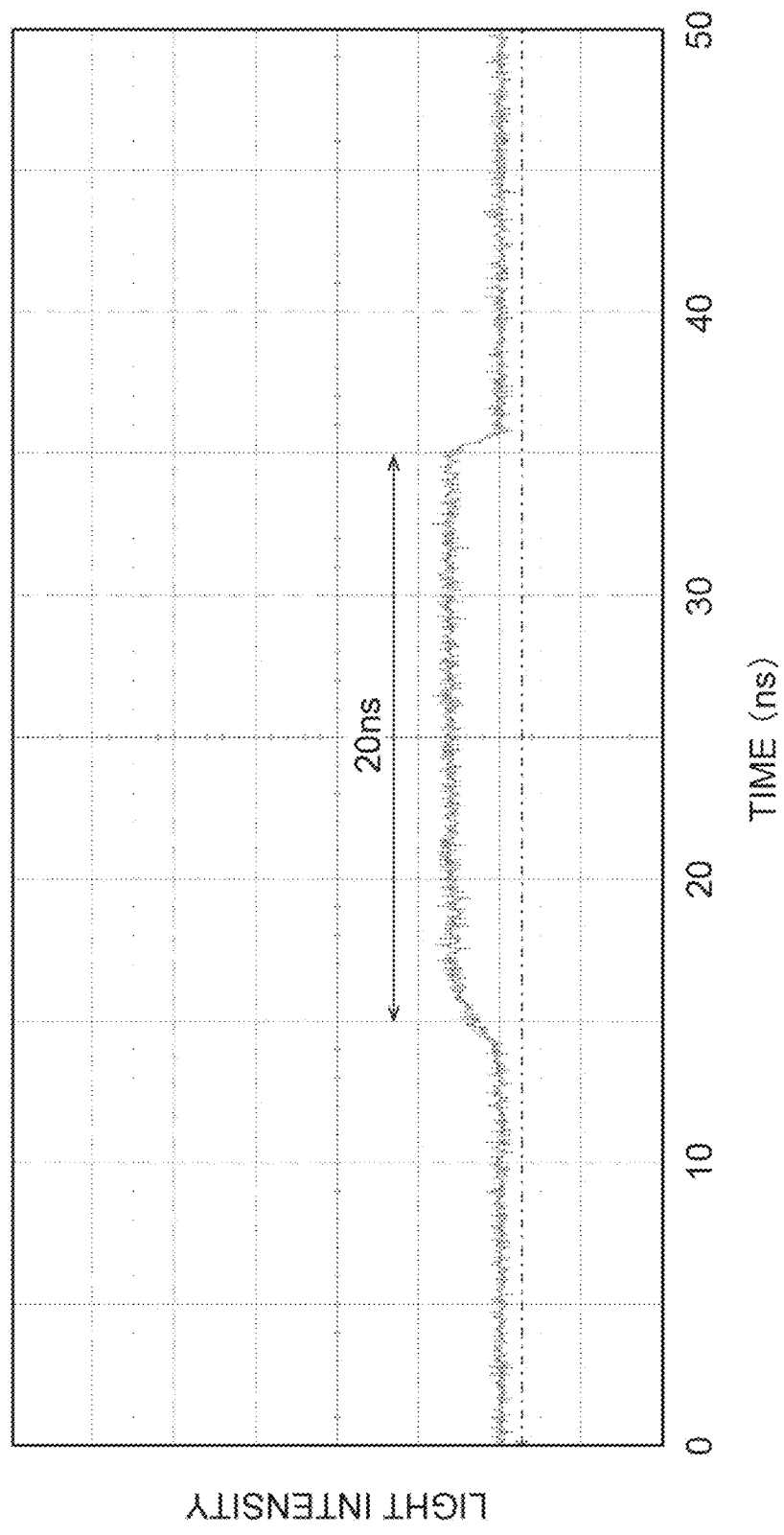
FIG. 15 is a graph showing a temporal waveform of the laser light L2 in the other example.

FIG. 14 and FIG. 15 are graphs showing temporal waveforms of the laser light L1 and the laser light L2 in another example. FIG. 14 shows the temporal waveform of the laser light L1, and FIG. 15 shows the temporal waveform of the laser light L2. In the present example, each of the laser light L1 and the laser light L2 has the temporal waveform of a rectangular wave shape with a flat top, and the time width is 20 nanoseconds.

Figure 16:
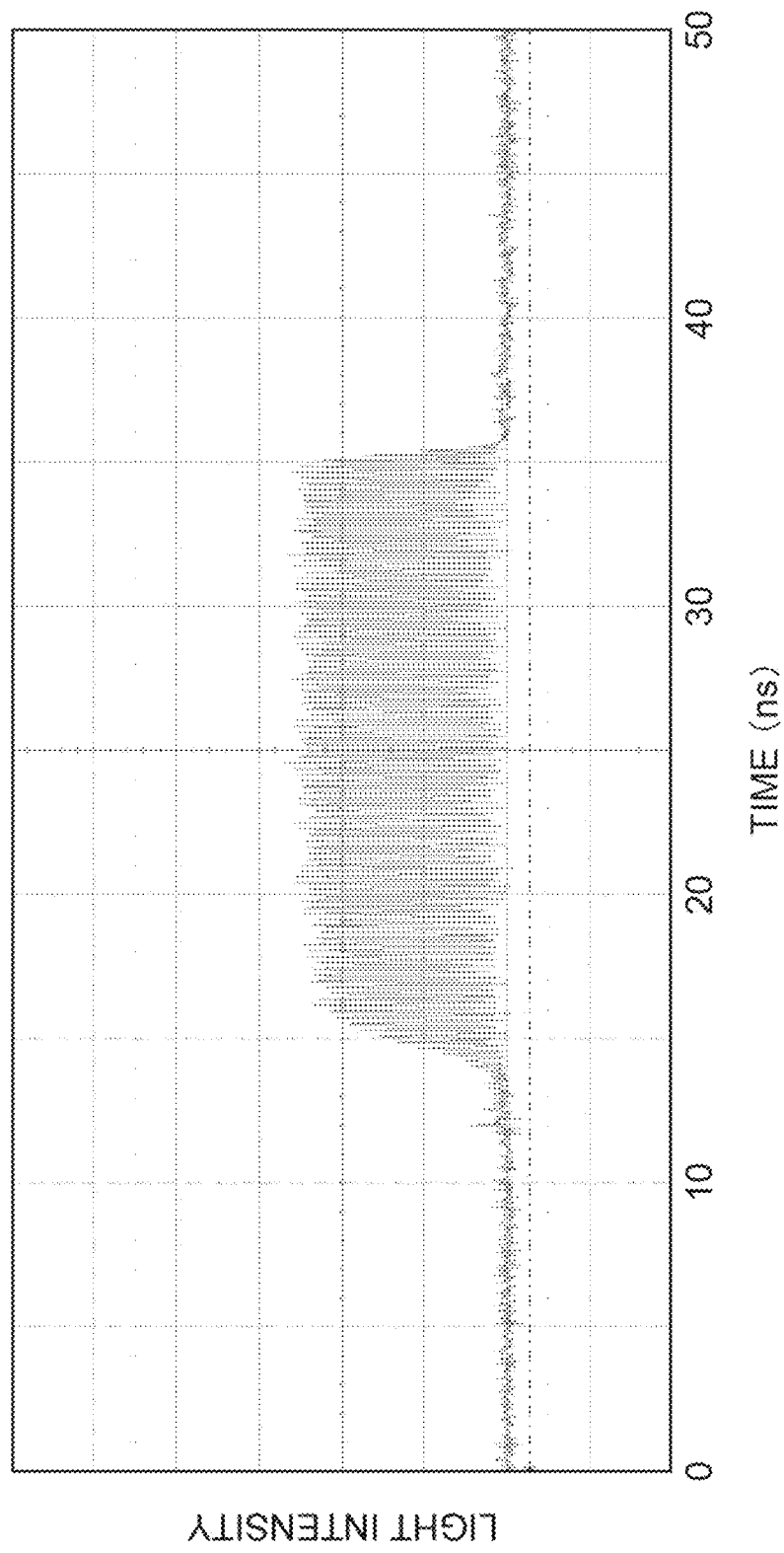
FIG. 16 is a graph showing the burst pulse generated in the other example.
Figure 17:
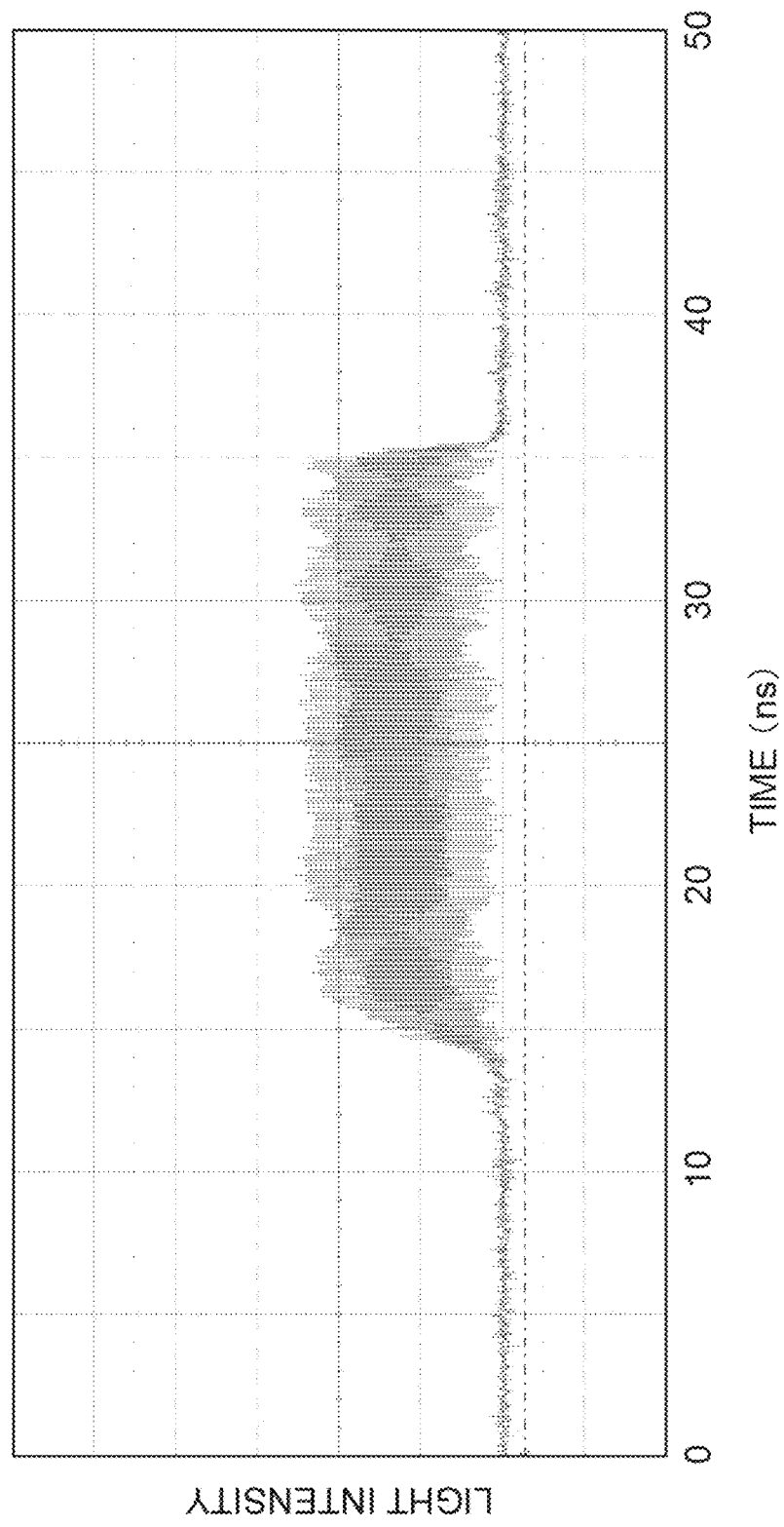
FIG. 17 is a graph showing the burst pulse generated in the other example.

FIG. 16 and FIG. 17 are graphs showing the burst pulses generated in the present example. FIG. 16 shows the burst pulse when the difference frequency $\Delta f$ is 5 GHz, and FIG. 17 shows the burst pulse when the difference frequency $\Delta f$ is 10 GHz. As shown in FIG. 16 and FIG. 17, in the present example, the envelope shape of the burst pulse is a rectangular wave shape according to the temporal waveforms of the laser light L1 and the laser light L2.

(First Modification)

Figure 18:
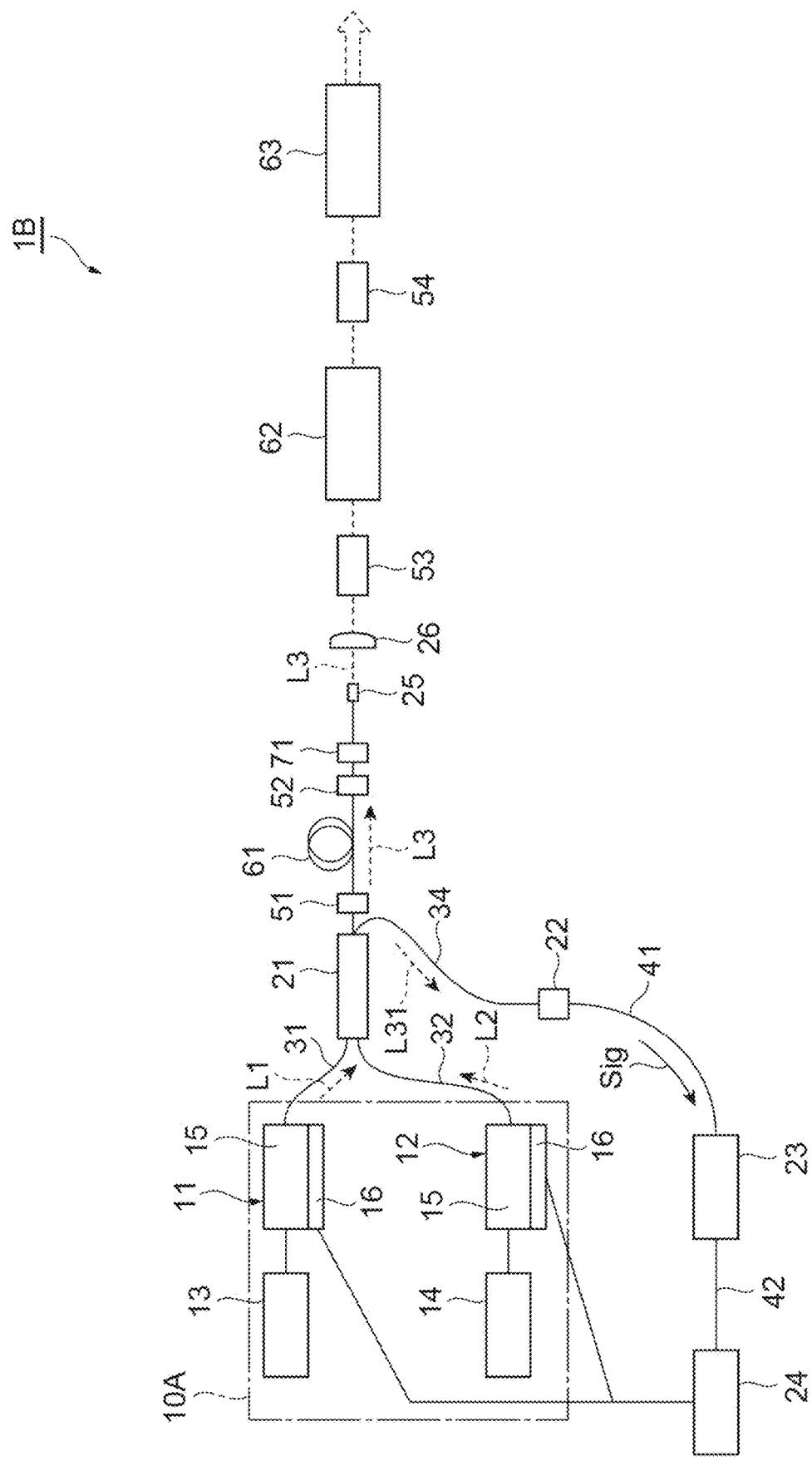
FIG. 18 is a diagram schematically illustrating a configuration of a laser apparatus 1B as a first modification.

FIG. 18 is a diagram schematically illustrating a configuration of a laser apparatus 1B as a first modification of the above embodiment. In addition to the configuration of the laser apparatus 1A of the above embodiment, the laser apparatus 1B includes optical isolators 51, 52, 53, and 54, an optical fiber amplifier 61, solid-state laser amplifiers 62 and 63, and a band-pass filter 71.

The optical fiber amplifier 61 includes an optical fiber made of glass doped with impurities such as Er and Yb, and amplifies the laser light L3 by inputting excitation light together with the laser light L3 to the optical fiber. The light input end of the optical fiber amplifier 61 and the light combining unit 21 are optically coupled via an optical fiber. The optical isolator 51 is interposed between the optical fiber amplifier 61 and the light combining unit 21. The optical isolator 51 prevents light (laser light L3 and excitation light) from returning from the optical fiber amplifier 61 to the light combining unit 21. This prevents damage to the semiconductor laser elements 15 of the laser light sources 11 and 12.

The light output end of the optical fiber amplifier 61 and the band-pass filter 71 are optically coupled via an optical fiber. The optical isolator 52 is interposed between the optical fiber amplifier 61 and the band-pass filter 71. The optical isolator 52 prevents light of the stage after the band-pass filter 71 from returning to the optical fiber amplifier 61.

The optical fiber amplifier 61 is a first stage optical amplifier, and amplifies the laser light L3 output from the light combining unit 21. The gain of the optical fiber amplifier 61 is, for example, in the range of 20 to 30 dB. The band-pass filter 71 blocks a wavelength component of fluorescence contained in the light output from the optical fiber amplifier 61. The band-pass filter 71 may be constituted by, for example, a dielectric multilayer film.

The band-pass filter 71 is optically coupled to the optical fiber connector 25 via an optical fiber. The light passing through the band-pass filter 71 propagates through the optical fiber and reaches the optical fiber connector 25 and is then output to the space.

The collimator lens 26 is optically coupled to the optical fiber connector 25 via the space, and collimates the light radially output from the optical fiber connector 25. The intensity of the light amplified by the solid-state laser amplifiers 62 and 63 described later is large, and thus, the light is propagated not through the optical fiber but through the space in the stage after the optical fiber connector 25 for preventing damage to the optical material such as glass by the laser.

Each of the solid-state laser amplifiers 62 and 63 may be made of glass or yttrium aluminum garnet (YAG) doped with impurities such as Nd. The solid-state laser amplifiers 62 and 63 amplify the laser light L3 by inputting excitation light together with the laser light L3.

The solid-state laser amplifier 62 is optically coupled to the collimator lens 26 via the optical isolator 53. The optical isolator 53 prevents light of the solid-state laser amplifier 62 from returning to the stage before the solid-state laser amplifier 62. This prevents damage to the optical fiber amplifier 61. The solid-state laser amplifier 62 is a second stage optical amplifier, and further amplifies the amplified laser light L3 output from the optical fiber amplifier 61. The gain of the solid-state laser amplifier 62 is, for example, in the range of 3 to 20 dB.

The solid-state laser amplifier 63 is optically coupled to the solid-state laser amplifier 62 via the optical isolator 54. That is, the optical fiber amplifier 61 and the solid-state laser amplifiers 62 and 63 are coupled in series with each other. The optical isolator 54 prevents light of the solid-state laser amplifier 63 from returning to the stage before the solid-state laser amplifier 63. This prevents damage to the solid-state laser amplifier 62. The solid-state laser amplifier 63 is a third stage optical amplifier, and further amplifies the amplified laser light L3 output from the solid-state laser amplifier 62. The gain of the solid-state laser amplifier 63 is, for example, in the range of 3 to 10 dB. The laser light L3 amplified by the solid-state laser amplifier 63 is output to the outside of the laser apparatus 1B.

The laser apparatus 1B of the present modification includes all of the configurations of the laser apparatus 1A of the above embodiment. Therefore, the same effects as those of the above embodiment can be obtained. Further, the laser apparatus 1B of the present modification includes the optical fiber amplifier 61 and the solid-state laser amplifiers 62 and 63, in addition to the configuration of the laser apparatus 1A of the above embodiment, and thus, it is possible to output the laser light L3 of large power.

(Second Modification)

Figure 19:
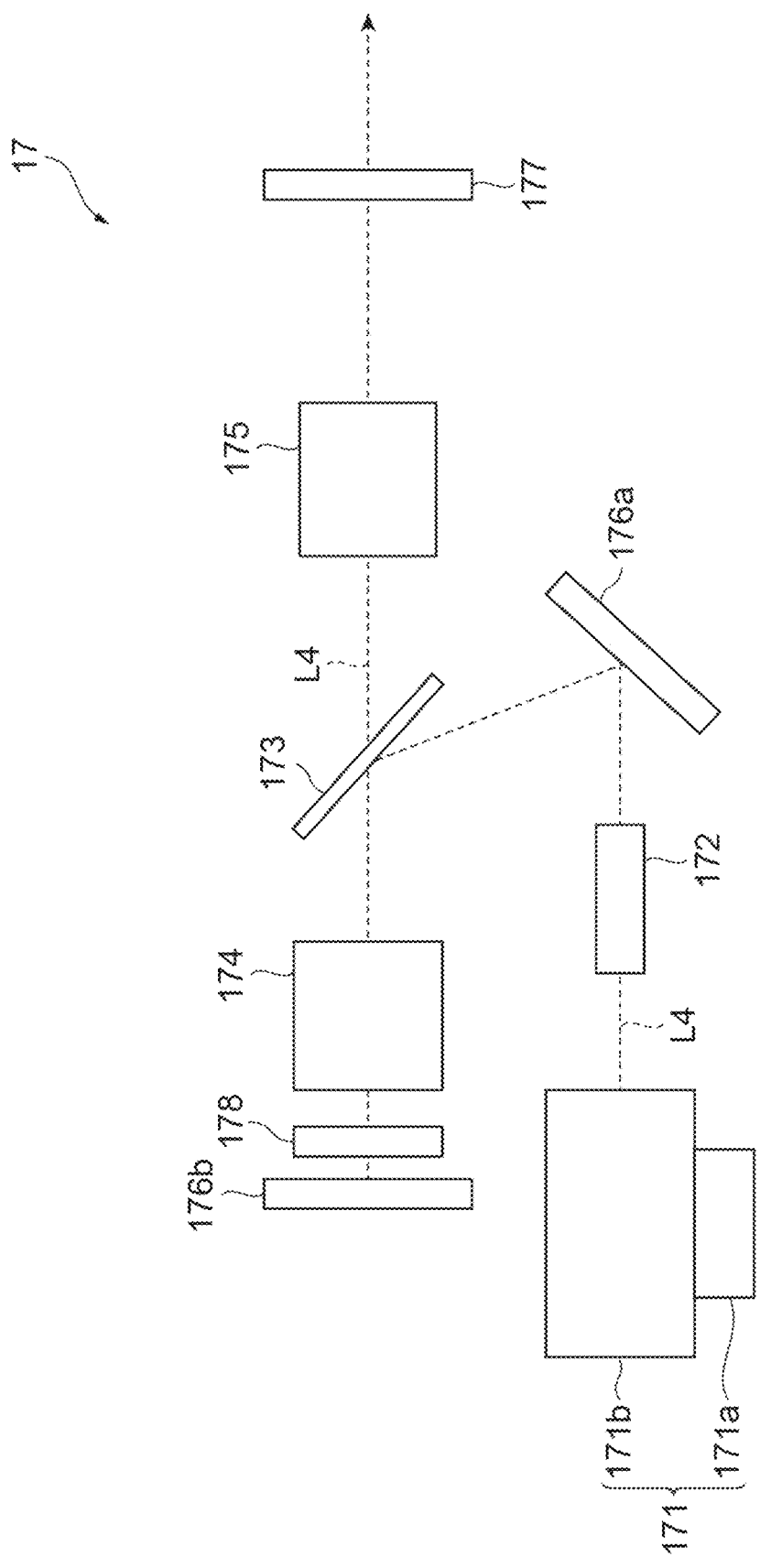
FIG. 19 is a diagram schematically illustrating a configuration of a light source 17 as a second modification.

FIG. 19 is a diagram schematically illustrating a configuration of a light source 17 as a second modification of the above embodiment. In the laser apparatus 1A of the above embodiment or the laser apparatus 1B of the first modification, one or both of the laser light sources 11 and 12 of the light source unit 10A may be replaced with the light source 17 of the present modification.

The light source 17 has a configuration as an injection locking type Q-switched laser. Specifically, the light source 17 includes a laser light source 171 as a seed light source, an isolator 172, a polarizer 173, an electro-optical element 174 as a Q-switch, a gain medium 175, total reflection mirrors 176a and 176b, a partial transmission mirror 177, and a ¼ wave plate 178. The laser light source 171 is a wavelength variable laser, and has a configuration similar to the laser light sources 11 and 12 of the above embodiment.

That is, it includes a temperature control unit 171a (for example, a Peltier element) and a semiconductor laser element 171b mounted on the temperature control unit 171a.

The total reflection mirror 176b and the partial transmission mirror 177 constitute an optical resonator. The electro-optical element 174, the ¼ wave plate 178, and the gain medium 175 are disposed on an optical path between the total reflection mirror 176b and the partial transmission mirror 177, and the polarizer 173 is further disposed on the optical path. The polarizer 173 is optically coupled to the semiconductor laser element 171b of the laser light source 171 via the total reflection mirror 176a and the isolator 172. The electro-optical element 174 is a crystal whose refractive index changes when a voltage is applied, and is made of, for example, BBO (beta barium borate) crystal, DKDP (potassium dideuterium phosphate) crystal, or the like.

When light L4 of a certain wavelength is output from the laser light source 171, the light L4 reaches the optical resonator via the isolator 172 and the total reflection mirror 176a. The isolator 172 prevents laser light generated in the optical resonator from returning to the semiconductor laser element 171b. This prevents damage to the semiconductor laser element 171b. The light L4 polarized by the polarizer 173 passes through the electro-optical element 174 to which no voltage is applied, and then travels back and forth via the ¼ wave plate 178 and the total reflection mirror 176b. Thus, a polarization direction of the light L4 is rotated by 90 degrees, and the light L4 passes through the polarizer 173 and reaches the gain medium 175.

A part of the light reflected by the partial transmission mirror 177 again travels back and forth via the ¼ wave plate 178, so that the polarization direction is again rotated by 90 degrees, and the light cannot pass through the polarizer 173 again. Therefore, the laser resonator is not configured, and thus, the laser oscillation does not occur. In such a low Q-value state, when a population inversion is caused by optical excitation of a semiconductor laser, a lamp, or the like, and a voltage is applied to the electro-optical element 174 when sufficient energy is stored, the light is always transmitted through the polarizer 173 by the combination with the ¼ wave plate 178, and the laser resonator is configured to increase the Q-value rapidly, thereby obtaining a pulse output.

As in the present modification, at least one of the laser light sources 11 and 12 may be a Q-switched laser. Further, in this case, the seed light source (light source 171) of the Q-switched laser may be a wavelength variable laser. Thus, it is possible to easily realize the configuration in which the wavelength of at least one of the laser light L1 and the laser light L2 is variable.

(Third Modification)

Figure 20:
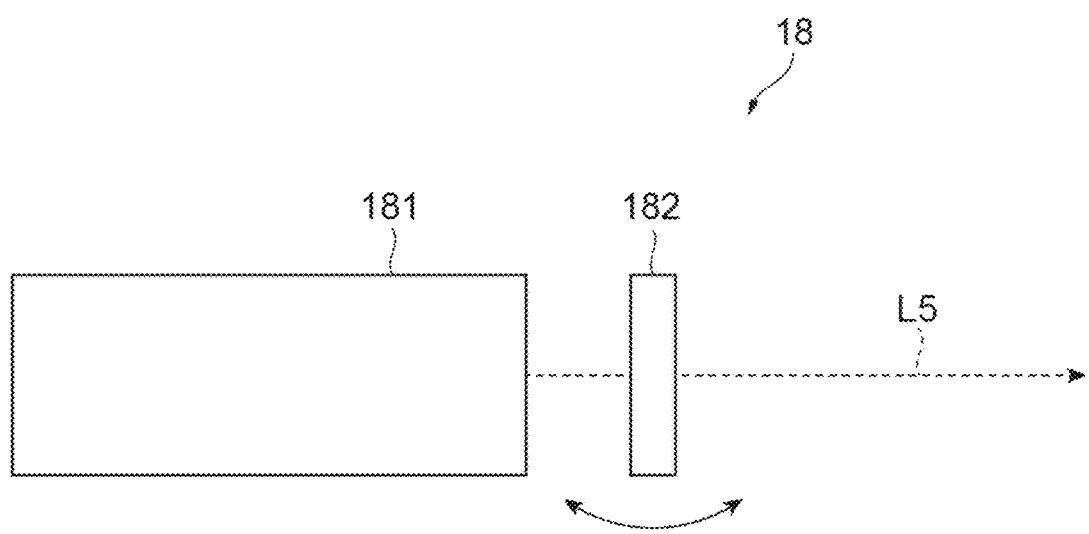
FIG. 20 is a diagram schematically illustrating a configuration of a light source 18 as a third modification.

FIG. 20 is a diagram schematically illustrating a configuration of a light source 18 as a third modification of the above embodiment. In the laser apparatus 1A of the above embodiment or the laser apparatus 1B of the first modification, one or both of the laser light sources 11 and 12 of the light source unit 10A may be replaced with the light source 18 of the present modification.

The light source 18 includes a semiconductor laser element 181 as a laser resonator and a volume Bragg grating (VBG) 182. The VBG 182 is a light reflection unit optically coupled to a light output end of the semiconductor laser element 181 and constituting one resonator end of the laser resonator.

A wavelength-light reflection property of the VBG 182 is variable according to a light incident angle, and when an angle of the VBG 182 with respect to an optical axis of output light from the semiconductor laser element 181 is changed, a wavelength returning to the semiconductor laser element 181 is changed. By using the above property, by adjusting the angle of the VBG 182 such that only light having a wavelength to be oscillated returns to the semiconductor laser element 181, laser light L5 having a desired wavelength can be output. According to the present modification, a wavelength variable laser can be easily realized.

(Fourth Modification)

(a) and (b) in FIG. 21 are diagrams schematically illustrating configurations of light sources 19A and 19B, respectively, as a fourth modification of the above embodiment. In the laser apparatus 1A of the above embodiment or the laser apparatus 1B of the first modification, one or both of the laser light sources 11 and 12 of the light source unit 10A may be replaced with the light source 19A or 19B of the present modification.

The light source 19A illustrated in (a) in FIG. 21 is called a Littrow configuration. The light source 19A includes a semiconductor laser element 191 as a laser resonator and a diffraction grating 192. The diffraction grating 192 is a light reflection unit optically coupled to a back face 191b of the semiconductor laser element 191 via a focusing lens 193 and constituting one resonator end of the laser resonator.

A wavelength-light reflection property of the diffraction grating 192 is variable according to a light incident angle, and when an angle of the diffraction grating 192 with respect to an optical axis of back light from the semiconductor laser element 191 is changed, a wavelength returning to the semiconductor laser element 191 is changed. By using the above property, by adjusting the angle of the diffraction grating 192 such that only light having a wavelength to be oscillated returns to the semiconductor laser element 191, laser light L6 having a desired wavelength can be output from a resonator end face 191a.

The light source 19B illustrated in (b) in FIG. 21 is called a Littman-Metcalf configuration. The light source 19B further includes a mirror 194 in addition to the configuration of the light source 19A described above. The mirror 194 is disposed opposite to the diffraction grating 192, and reflects diffracted light from the diffraction grating 192. In this case, the light reflectance of the resonator end face 191a of the semiconductor laser element 191 is set to 90% or more, and the laser light L6 having a desired wavelength is extracted from the diffraction grating 192 instead of the resonator end face 191a by changing an angle of the mirror 194.

As described above, according to the configuration of the light source 19A or 19B of the present modification, a wavelength variable laser can also be easily realized.

(Fifth Modification)

Figure 22:
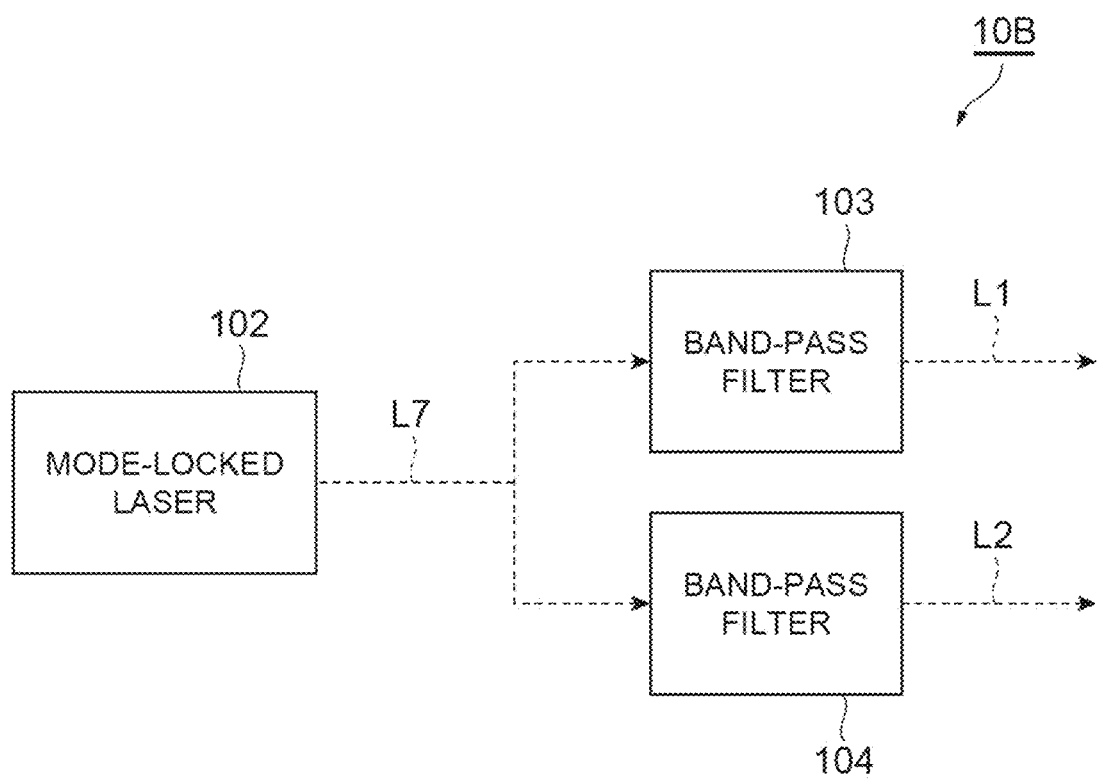
FIG. 22 is a diagram schematically illustrating a configuration of a light source unit 10B as a fifth modification.

FIG. 22 is a diagram schematically illustrating a configuration of a light source unit 10B as a fifth modification of the above embodiment. In the laser apparatus 1A of the above embodiment or the laser apparatus 1B of the first modification, the light source unit 10A may be replaced with the light source unit 10B of the present modification.

As illustrated in FIG. 22, the light source unit 10B includes a mode-locked laser light source 102, a first band-pass filter 103, and a second band-pass filter 104. The first band-pass filter 103 is optically coupled to the mode-locked laser light source 102, and extracts a component corresponding to the wavelength of the laser light L1 from laser light L7 output from the mode-locked laser light source 102. The second band-pass filter 104 is optically coupled to the mode-locked laser light source 102, and extracts a component corresponding to the wavelength of the laser light L2 from the laser light L7 output from the mode-locked laser light source 102. According to the present modification, the laser light sources for generating the laser light L1 and the laser light L2 having different wavelengths can be configured in common, and thus, the light source unit can be simply configured.

(Sixth Modification)

(a) and (b) in FIG. 23 are diagrams schematically illustrating configurations of light sources 20A and 20B, respectively, as a sixth modification of the above embodiment. In the laser apparatus 1A of the above embodiment or the laser apparatus 1B of the first modification, one or both of the laser light sources 11 and 12 of the light source unit 10A may be replaced with the light source 20A or 20B of the present modification.

The light source 20A illustrated in (a) in FIG. 23 includes a solid-state laser oscillator 112 and a waveform shaping unit 113. The solid-state laser oscillator 112 includes a pair of resonator end faces 114 and 115 and a gain medium 116 disposed on an optical path between the pair of resonator end faces 114 and 115.

The resonator end face 115 is an output coupling mirror, and has a wavelength-transmission property in which the transmittance changes according to a wavelength. By making the transmission wavelength of the resonator end face 115 variable, the output wavelength from the solid-state laser oscillator 112 can be made variable. The waveform shaping unit 113 is optically coupled to the resonator end face 115. A temporal waveform of laser light L8 output from the solid-state laser oscillator 112 is shaped into a desired shape (rectangular wave shape, Gaussian wave shape, or the like) by the waveform shaping unit 113.

The light source 20B illustrated in (b) in FIG. 23 includes a fiber laser oscillator 117 and the waveform shaping unit 113. The fiber laser oscillator 117 includes a pair of fiber Bragg gratings (FBGs) 118 and 119 and an optical fiber 120 connected between the pair of FBGs 118 and 119 and containing a gain medium.

The FBG 119 has a wavelength-transmission property in which the transmittance changes according to a wavelength. By making the transmission wavelength of the FBG 119 variable, the output wavelength from the fiber laser oscillator 117 can be made variable. The waveform shaping unit 113 is optically coupled to the FBG 119. A temporal waveform of laser light L9 output from the fiber laser oscillator 117 is shaped into a desired shape (rectangular wave shape, Gaussian wave shape, or the like) by the waveform shaping unit 113.

The laser apparatus and the laser light generation method are not limited to the embodiment and configuration examples described above, and various modifications are possible.

For example, a configuration for making the wavelengths of the first laser light and the second laser light variable in the light source unit is not limited to the above embodiment and modifications, and various other methods can be applied. Further, in the above embodiment, the drive circuits 13 and 14 control the waveforms of the laser light L1 and the laser light L2 before the combining to be waveforms identical to each other, but instead of or in addition to this method, the waveform of the laser light L3 after the combining may be controlled by an optical switch such as an acousto-optical modulation element and an electro-optical modulation element.

The laser apparatus of the above embodiment includes a light source unit for outputting first laser light and second laser light having a wavelength different from that of the first laser light to different optical paths; and a light combining unit optically coupled to the light source unit, and for combining the first laser light and the second laser light to generate a burst pulse with a frequency according to a difference between the wavelength of the first laser light and the wavelength of the second laser light, and in the light source unit, the wavelengths of the first laser light and the second laser light are set in advance or settable such that the frequency of the burst pulse is a certain frequency (desired frequency), and the certain frequency is 1 GHz or more.

The laser light generation method of the above embodiment includes a first step of outputting first laser light and second laser light having a wavelength different from that of the first laser light to different optical paths; and a second step of combining the first laser light and the second laser light to generate a burst pulse with a frequency according to a difference between the wavelength of the first laser light and the wavelength of the second laser light, and in the first step, the wavelengths of the first laser light and the second laser light are set such that the frequency of the burst pulse is 1 GHz or more.

In the above laser apparatus, the certain frequency (desired frequency) may be 2000 GHz or less. Further, in the above laser apparatus, the certain frequency may be 1000 GHz or less, or 100 GHz or less.

When a repetition frequency of a light pulse train is too high, it is regarded as continuous light rather than the burst pulse, and by suppressing the repetition frequency of the light pulse train to the above extent, a burst pulse that can be suitably used for, for example, laser processing can be generated.

In the above laser apparatus, in the light source unit, at least one of the wavelengths of the first laser light and the second laser light may be variable. In this case, the repetition frequency of the burst pulse can be accurately controlled by feedback control. Further, the repetition frequency of the burst pulse can be made variable, and the irradiation conditions can be easily changed in laser processing or the like.

In the above laser apparatus, at least one of a laser light source for generating the first laser light and a laser light source for generating the second laser light may be a wavelength variable laser. Further, in the above laser apparatus, at least one of a laser light source for generating the first laser light and a laser light source for generating the second laser light may be a Q-switched laser, and a seed light source of the Q-switched laser may be a wavelength variable laser. In these configurations, it is possible to easily realize a configuration in which the wavelength of at least one of the first laser light and the second laser light is variable.

In the above laser apparatus, the wavelength variable laser may include a distributed feedback type semiconductor laser element; and a temperature control unit for changing a temperature of the semiconductor laser element according to an electric signal. Further, in the above laser apparatus, the wavelength variable laser may include a laser resonator; and a light reflection unit constituting one resonator end of the laser resonator and having a variable wavelength-light reflection property. In these configurations, the wavelength variable laser can be easily realized.

In the above laser apparatus, the light source unit may include a mode-locked laser light source; a first band-pass filter optically coupled to the mode-locked laser light source, and for extracting a component corresponding to the wavelength of the first laser light from the laser light output from the mode-locked laser light source; and a second band-pass filter optically coupled to the mode-locked laser light source, and for extracting a component corresponding to the wavelength of the second laser light from the laser light output from the mode-locked laser light source. In this case, the laser light sources for generating the first laser light and the second laser light with different wavelengths can be configured in common, and the light source unit can be made simple.

The above laser apparatus may further include a waveform control unit for controlling waveforms of the first laser light and the second laser light before the combining to be waveforms identical to each other. In this case, a shape of an envelope of the burst pulse output from the light combining unit can be controlled. Further, for example, when the light source unit includes a semiconductor laser element, the waveform control unit may control a temporal waveform of a supply current to the semiconductor laser element. In this case, an optical component for shaping the waveform is not necessary, and thus, the configuration of the laser apparatus can be simplified.

INDUSTRIAL APPLICABILITY

The embodiments can be used as a laser apparatus and a laser light generation method capable of generating a burst pulse having a high repetition frequency of 1 GHz or more.

REFERENCE SIGNS LIST 1A, 1B—laser apparatus, 10A, 10B—light source unit, 11, 12—laser light source, 13, 14—drive circuit, 15—semiconductor laser element, 16—temperature control unit, 17, 18, 19A, 19B, 20A, 20B—light source, 21—light combining unit, 22—photodetector, 23—frequency measurement unit, 24—temperature controlling computer, 25—optical fiber connector, 26—collimator lens, 31-34—optical fiber, 41—44—wiring line, 51-54—optical isolator, 61—optical fiber amplifier, 62, 63—solid-state laser amplifier, 71—band-pass filter, 102—mode-locked laser light source, 103, 104—band-pass filter, 112—solid-state laser oscillator, 113—waveform shaping unit, 114, 115—resonator end face, 116—gain medium, 117—fiber laser oscillator, 118, 119—fiber Bragg grating (FBG), 120—optical fiber, 171—laser light source, 172—isolator, 173—polarizer, 174—electro-optical element, 175—gain medium, 176a, 176b—total reflection mirror, 177—partial transmission mirror, 178—¼ wave plate, 171a—temperature control unit, 171b, 181, 191—semiconductor laser element, 191a—resonator end face, 191b—back face, 192—diffraction grating, 193—focusing lens, 194—mirror, B1—B3—envelope, L1—L9—laser light, Sig—electric signal.

The invention claimed is:
1. A laser apparatus comprising:
  a light source unit configured to output first laser light and second laser light having a wavelength different from that of the first laser light to different optical paths;
  a light combining unit optically coupled to the light source unit, and configured to combine the first laser light and the second laser light to generate a burst pulse with a frequency according to a difference between the wavelength of the first laser light and the wavelength of the second laser light and with a range defined by an envelope; and
  a waveform control unit configured to control waveforms of the first laser light and the second laser light before the combining to be waveforms identical to each other to control a shape of the envelope of the burst pulse, wherein
  in the light source unit, the wavelengths of the first laser light and the second laser light are set in advance or settable such that the frequency of the burst pulse is a certain frequency, and
  the certain frequency is 1 GHz or more.
2. The laser apparatus according to claim 1, wherein the certain frequency is 2000 GHz or less.
3. The laser apparatus according to claim 1, wherein, in the light source unit, at least one of the wavelengths of the first laser light and the second laser light is variable.
4. The laser apparatus according to claim 3, wherein at least one of a laser light source configured to generate the first laser light and a laser light source configured to generate the second laser light is a wavelength variable laser.
5. The laser apparatus according to claim 3, wherein at least one of a laser light source configured to generate the first laser light and a laser light source configured to generate the second laser light is a Q-switched laser, and a seed light source of the Q-switched laser is a wavelength variable laser.
6. The laser apparatus according to claim 4, wherein the wavelength variable laser includes a distributed feedback type semiconductor laser element; and
  a temperature control unit configured to change a temperature of the semiconductor laser element according to an electric signal.
7. The laser apparatus according to claim 4, wherein the wavelength variable laser includes a laser resonator; and a light reflection unit constituting one resonator end of the laser resonator and having a variable wavelength-light reflection property.
8. The laser apparatus according to claim 1, wherein the light source unit includes:
  a mode-locked laser light source;
  a first band-pass filter optically coupled to the mode-locked laser light source, and configured to extract a component corresponding to the wavelength of the first laser light from the laser light output from the mode-locked laser light source; and
  a second band-pass filter optically coupled to the mode-locked laser light source, and configured to extract a component corresponding to the wavelength of the second laser light from the laser light output from the mode-locked laser light source.
9. The laser apparatus according to claim 5, wherein the wavelength variable laser includes a distributed feedback type semiconductor laser element; and
  a temperature control unit configured to change a temperature of the semiconductor laser element according to an electric signal.
10. The laser apparatus according to claim 5, wherein the wavelength variable laser includes a laser resonator; and a light reflection unit constituting one resonator end of the laser resonator and having a variable wavelength-light reflection property.
11. A laser light generation method comprising:
  outputting first laser light and second laser light having a wavelength different from that of the first laser light to different optical paths; and
  combining the first laser light and the second laser light to generate a burst pulse with a frequency according to a difference between the wavelength of the first laser light and the wavelength of the second laser light and with a range defined by an envelope, wherein
  in the outputting, the wavelengths of the first laser light and the second laser light are set such that the frequency of the burst pulse is 1 GHz or more, and waveforms of the first laser light and the second laser light before the combining are controlled to be waveforms identical to each other to control a shape of the envelope of the burst pulse.

* * * * *